(12) United States Patent
Lan

(10) Patent No.: US 10,921,067 B2
(45) Date of Patent: Feb. 16, 2021

(54) WATER-COOLING RADIATOR STRUCTURE WITH INTERNAL PARTITION MEMBER

(71) Applicant: ASIA VITAL COMPONENTS CO., LTD., New Taipei (TW)

(72) Inventor: Wen-Ji Lan, New Taipei (TW)

(73) Assignee: Asia Vital Components Co., LTD, New Taipei (TW)

( * ) Notice: Subject to any disclaimer, the term of this patent is extended or adjusted under 35 U.S.C. 154(b) by 264 days.

(21) Appl. No.: 15/867,714

(22) Filed: Jan. 11, 2018

(65) Prior Publication Data

US 2019/0212077 A1    Jul. 11, 2019

(51) Int. Cl.
| | |
|---|---|
| *F28F 3/12* | (2006.01) |
| *F28F 13/06* | (2006.01) |
| *G06F 1/20* | (2006.01) |
| *F28D 1/03* | (2006.01) |
| *F28D 21/00* | (2006.01) |
| *H05K 7/20* | (2006.01) |

(52) U.S. Cl.
CPC .............. *F28F 3/12* (2013.01); *F28D 1/0383* (2013.01); *F28F 13/06* (2013.01); *G06F 1/20* (2013.01); *H05K 7/20254* (2013.01); *H05K 7/20272* (2013.01); *F28D 2021/0031* (2013.01); *F28F 2250/102* (2013.01); *H05K 7/20218* (2013.01); *H05K 7/20263* (2013.01)

(58) Field of Classification Search
CPC ... F28F 3/12; H05K 7/20218; H05K 7/20263; H05K 7/20272
USPC .......................................... 165/80.4; 361/699
See application file for complete search history.

(56) References Cited

U.S. PATENT DOCUMENTS

| | | | | |
|---|---|---|---|---|
| 5,203,406 A | * | 4/1993 | Blomgren ................ | C01D 3/06 159/28.6 |
| 6,648,064 B1 | * | 11/2003 | Hanson ................. | H01L 23/473 165/104.25 |
| 6,988,535 B2 | * | 1/2006 | Upadhya ................. | F04B 17/00 165/104.21 |
| 7,028,761 B2 | * | 4/2006 | Lee ........................... | F28F 3/12 165/104.33 |
| 2006/0005945 A1 | * | 1/2006 | Wei ....................... | H01L 23/467 165/80.3 |

(Continued)

FOREIGN PATENT DOCUMENTS

JP    2017223397 A  *  12/2017

OTHER PUBLICATIONS

Translation of Japanese Patent Document JP 2017223397 A entitled Translation—JP 2017223397 A (Year: 2020).*

*Primary Examiner* — Paul Alvare
(74) *Attorney, Agent, or Firm* — Demian K. Jackson; Jackson IPG PLLC

(57) ABSTRACT

A water-cooling radiator structure with internal partition member includes a water-cooling radiator unit, which includes a first water-receiving plate defining a first inner space and having a water inlet and a water outlet fluid-communicable with the first inner space. A working fluid flows into the first inner space via the water inlet and leaves the first inner space via the water outlet. The first inner space is internally provided with at least one first partition member, which horizontally divides the first inner space into a plurality of independent water chambers, so that the working fluid sequentially flow through the water chambers.

2 Claims, 30 Drawing Sheets

(56) References Cited

U.S. PATENT DOCUMENTS

| | | | |
|---|---|---|---|
| 2006/0021737 A1* | 2/2006 | Lee | F28D 15/00 |
| | | | 165/80.4 |
| 2006/0137863 A1* | 6/2006 | Lee | G06F 1/20 |
| | | | 165/104.33 |
| 2007/0012423 A1* | 1/2007 | Kinoshita | H01L 23/473 |
| | | | 165/80.4 |
| 2008/0223552 A1* | 9/2008 | Onishi | F28F 3/12 |
| | | | 165/80.4 |
| 2017/0212560 A1* | 7/2017 | Tsai | G06F 1/20 |

* cited by examiner

WATER-COOLING RADIATOR STRUCTURE WITH INTERNAL PARTITION MEMBER

FIELD OF THE INVENTION

The present invention relates to a heat dissipation structure, and more particularly, to a water-cooling radiator structure with internal partition member.

BACKGROUND OF THE INVENTION

Many electronic elements in a computer will produce a large quantity of heat when the computer operates. Hence, a good heat dissipation system is a key factor that determines the effectiveness and reliability of a computer. In a computer, the workload of the central processing unit (CPU) and the graphic processing unit (GPU) is higher than any other heat-producing elements in the computer, and accordingly, solutions for dissipating heat produced by the CPU and the GPU are no doubt very important. Particularly, the currently available computer games all include highly exquisite images that require computer-aided design (CAD) software with increasingly enhanced functions to achieve. However, the operation of such CAD software will render the CPU and the GPU into a heavy workload state to produce a huge quantity of heat. Heat accumulated in the computer would result in lowered performance of the CPU and GPU, or, in some worse condition, even result in damages or largely shortened service life of the CPU and GPU.

Different water cooling systems are available in the market for lowering the working temperature of the heat-producing electronic elements. A conventional water cooling system generally includes a water-cooling radiator fluid-communicably connected to a pump and a water block via two water pipes. The water block is in contact with a heat-producing element, such as a CPU. The pump drives a cooling liquid, i.e. a working fluid such as water, from the water block to flow into the water-cooling radiator, so that heat absorbed and carried by the working fluid is transferred to and dissipated from the water-cooling radiator into ambient air. The pump drives the cooling liquid to continuously circulate between the water-cooling radiator and the water block to enable quick removal of heat from the heat-producing electronic element. FIG. 1 shows a conventional water-cooling radiator structure 1, which includes a plurality of radiating fins 11, a plurality of straight flat pipes 12, and two side water tanks 13. The radiating fins 11 are arranged between any two adjacent flat pipes 12 and the two side water tanks 13 are soldered to the radiating fins 11 and two opposite ends of the flat pipes 12, so that the two side water tanks 13, the radiating fins 11 and the straight flat pipes 12 together constitute the water-cooling radiator structure 1. A first one of the two side water tanks 13 is provided with a water inlet 131 and a water outlet 132, which are separately connected to the above-mentioned two water pipes (not shown).

The working fluid flowed into the first side water tank 13 via the water inlet 131 quickly and straightly flows through the straight flat pipes 12 to the second side water tank 13, and then quickly flows back to the first side water tank 13 via the straight flat pipes 12 and leaves the water-cooling radiator structure 1 via the water outlet 132. Therefore, the time period from the entering to the leaving of the heat-carrying working fluid into and from the water-cooling radiator structure 1 is very short and there is not sufficient time for the heated working fluid to exchange heat with the water-cooling radiator structure 1. As a result, the conventional water-cooling radiator structure 1 could not effectively remove the heat from the working fluid flowing therethrough and has the problem of poor heat dissipation efficiency. In addition, the conventional water-cooling radiator structure 1 is an integral structure, which is not adjustable or changeable according to the internal space of an electronic device that uses the water-cooling radiator structure 1. Therefore, to use the water-cooling radiator structure 1 inside an electronic device, such as a computer or a server, the electronic device must have an independent internal space sufficient for installing the water-cooling radiator structure 1.

It is therefore tried by the inventor to develop an improved water-cooling radiator structure with internal partition member to overcome the problems and disadvantages in the prior art water-cooling radiator structure.

SUMMARY OF THE INVENTION

A primary object of the present invention is to provide a water-cooling radiator structure that includes a water-cooling radiator unit having at least one water-receiving plate. The water-receiving plate is internally provided with at least one partition member to horizontally divide an inner space of the water-receiving plate into a plurality of independent water chambers, so that a working fluid flowed into the water-receiving plate can sequentially flow through the water chambers and the working fluid in different water chambers can reach a homogeneous temperature.

Another object of the present invention is to provide a water-cooling radiator structure having internal partition member. The water-cooling radiator structure includes a first and a second water-receiving plate as well as a first, a second, a third and a fourth communicating element. A heat-carrying working fluid sequentially flows through the first and the second water-receiving plate via the first to the fourth communicating element, such that the working fluid has sufficient time to exchange heat with the first and second water-receiving plates.

To achieve the above and other objects, the water-cooling radiator structure having internal partition member according to the present invention includes a water-cooling radiator unit, which includes a first water-receiving plate having a first inner space fluid-communicable with a water inlet and a water outlet of the first water-receiving plate. A heat-carrying working fluid flows into the first inner space via the water inlet and leaves the first inner space via the water outlet. At least one first partition member is provided in the first inner space to horizontally divide the same into a plurality of independent water chambers.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
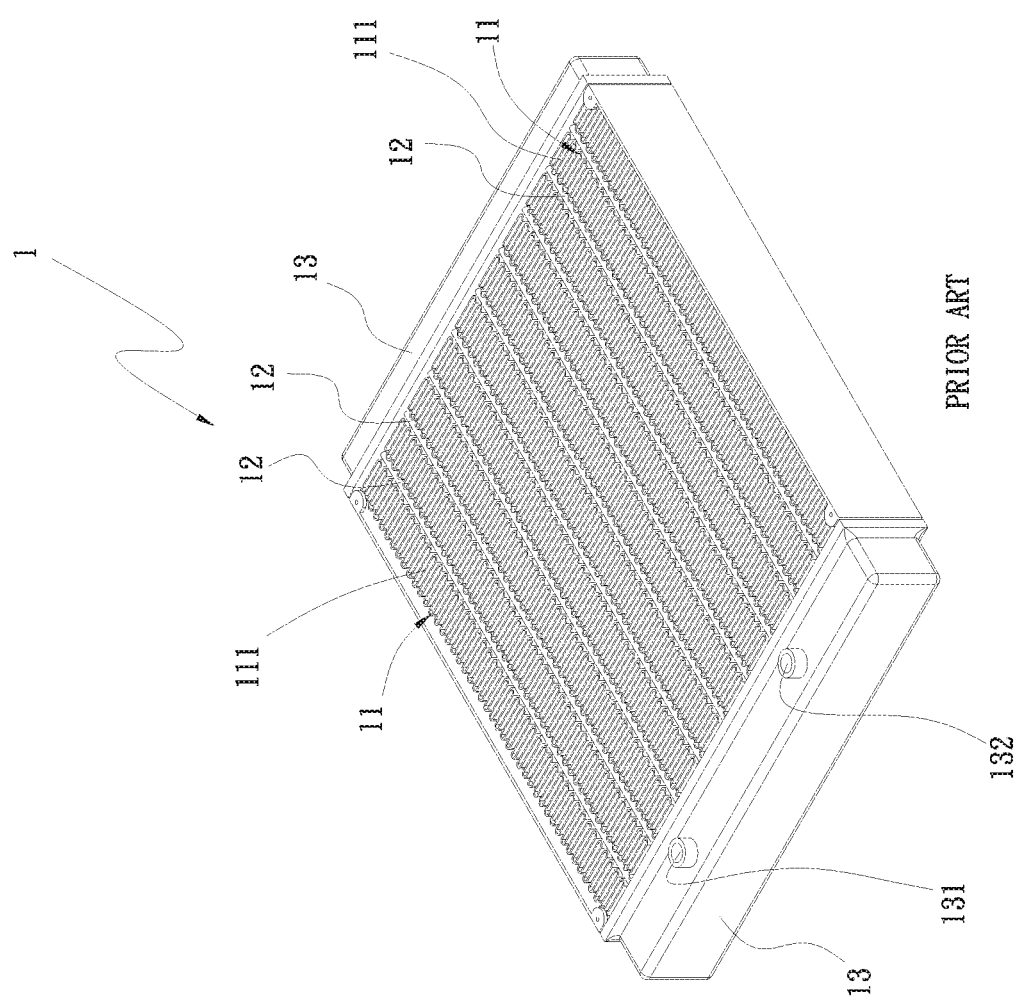
FIG. 1 is an assembled perspective view of a prior art water-cooling radiator structure.

The present invention will now be described with some preferred embodiments thereof and by referring to the accompanying drawings. For the purpose of easy to understand, elements that are the same in the preferred embodiments are denoted by the same reference numerals.

Figure 2A:
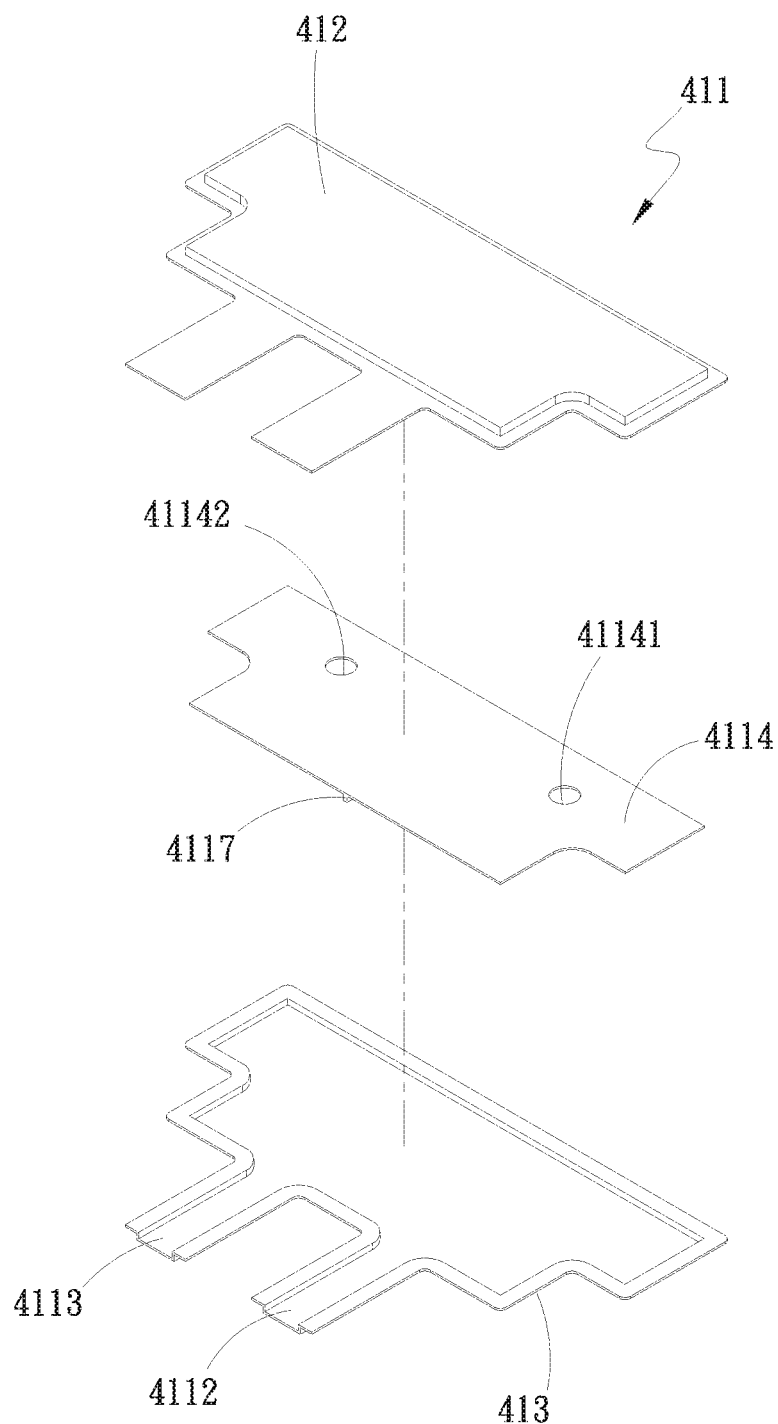
FIG. 2A is an exploded perspective view of a water-cooling radiator structure with internal partition member according to a first embodiment of the present invention.
Figure 2B:
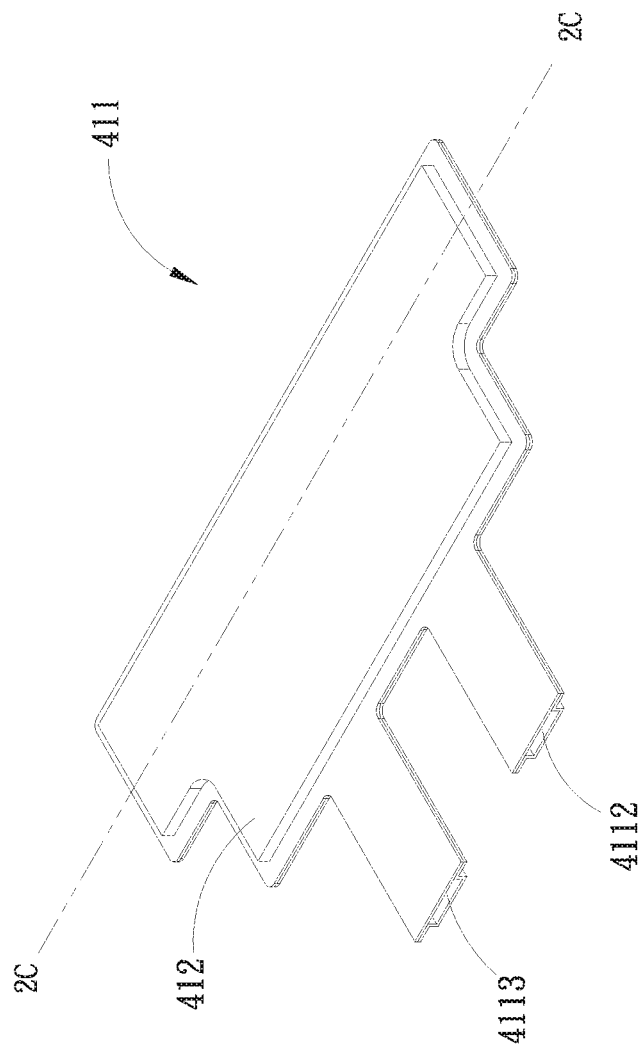
FIG. 2B is an assembled perspective view of FIG. 2A.
Figure 2C:
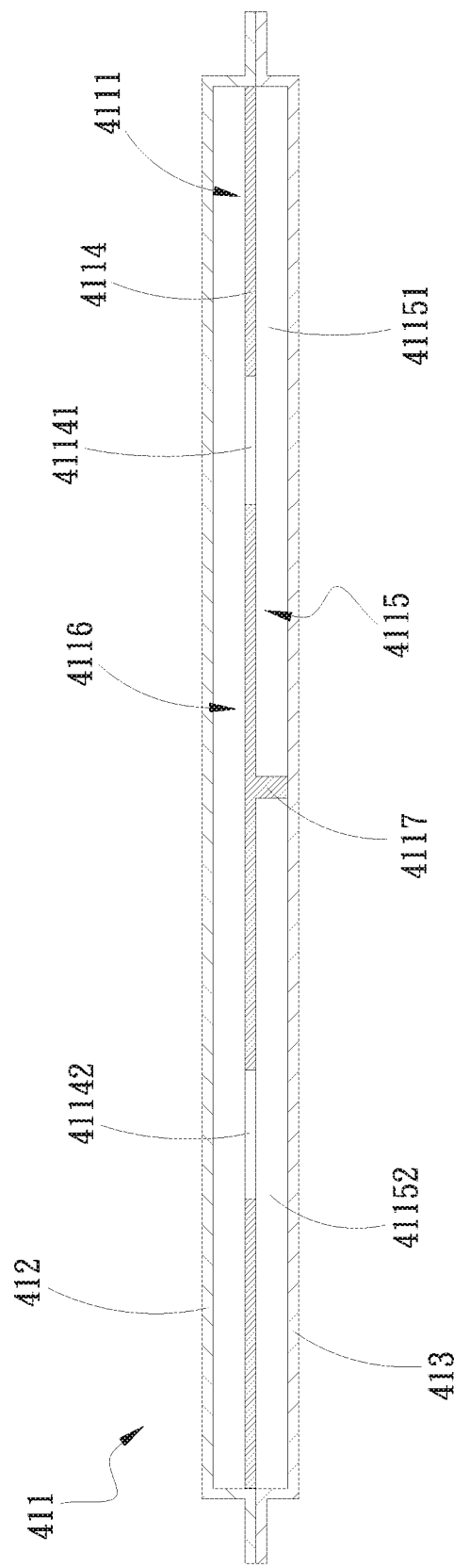
FIG. 2C is an assembled sectional view taken along line 2C-2C of FIG. 2B.

Please refer to FIGS. 2A and 2B, which are exploded and assembled perspective views, respectively, of a water-cooling radiator structure with internal partition member according to a first embodiment of the present invention, and to FIG. 2C, which is an assembled sectional view taken along line 2C-2C of FIG. 2B. For the purpose of conciseness and clarity, the present invention is also briefly referred to as the water-cooling radiator structure herein. As shown, in the first embodiment, the water-cooling radiator structure includes a water-cooling radiator unit 21 consisting of a first water-receiving plate 411, which internally defines a first inner space 4111 communicable with a water inlet 4112 and a water outlet 4113 formed on the first water-receiving plate 411. A working fluid flows into the first inner space 4111 via the water inlet 4112 and leaves the first inner space 4111 via the water outlet 4113. In the first inner space 4111, there is provided at least one first partition means to horizontally divide the first inner space 4111 into a plurality of independent water chambers.

As shown in FIGS. 2A to 2C, the first water-receiving plate 411 is formed of a first top plate member 412 and a first bottom plate member 413. The at least one first partition means is located between the first top and the first bottom plate member 412, 413, and includes a first partition member 4114 that horizontally divides the first inner space 4111 into a first water chamber 4115 and a second water chamber 4116 located above the first water chamber 4115. That is, the first partition member 4114 is located between the first and the second water chamber 4115, 4116. The first partition member 4114 is connected along its outer peripheral edges to inner wall surfaces of the first top plate member 412 or of the first bottom plate member 413. The first partition member 4114 can be integrally formed with the first top plate member 412 or the first bottom plate member 413, or can be an individual member connected to the first top plate member 412 or the first bottom plate member 413. The first water chamber 4115 is vertically divided by a first partitioning rib 4117 into a first zone 41151 communicable with the water inlet 4112 and a second zone 41152 communicable with the water outlet 4113. The first partitioning rib 4117 can be integrally formed with the first partition member 4114 to protrude toward the first bottom plate member 413, or can be integrally formed with the first bottom plate member 413 to protrude toward the first partition member 4114.

The first partition member 4114 is provided with a first communicating element 41141 and a second communicating element 41142, each of which can be, for example, a through hole penetrating the first partition member 4114. The first communicating element 41141 communicates the first zone 41151 of the first water chamber 4115 with the second water chamber 4116; and the second communicating element 41142 communicates the second zone 41152 of the first water chamber 4115 with the second water chamber 4116.

A working fluid, such as pure water, flows into the first zone 41151 of the first water chamber 4115 via the water inlet 4112 and then, flows into the second water chamber 4116 via the first communicating element 41141. The working fluid keeps flowing from the second water chamber 4116 into the second zone 41152 of the first water chamber 4115 via the second communicating element 41142 and finally leaves the first water-receiving plate 411 via the water outlet 4113.

It is noted the working fluid has absorbed heat outside the first water-receiving plate 411. When the working fluid flows into the first water-receiving plate 411, heat absorbed and carried by the working fluid is transferred to the first top plate member 412 and the first bottom plate member 413, from where the heat is dissipated into ambient air and the working fluid is cooled when it leaves the first water-receiving plate 411. Moreover, heat carried by the working fluid that is currently in the first zone 41151 of the first water chamber 4115 can be transferred via the first partition member 4114 to the working fluid that is currently in the second water chamber 4116, so that the working fluid in the first zone 41151 and the second water chamber 4116 can reach a homogeneous temperature. Similarly, the working fluid in the second zone 41152 and the second water chamber 4116 can also reach a homogeneous temperature.

Figure 3A:
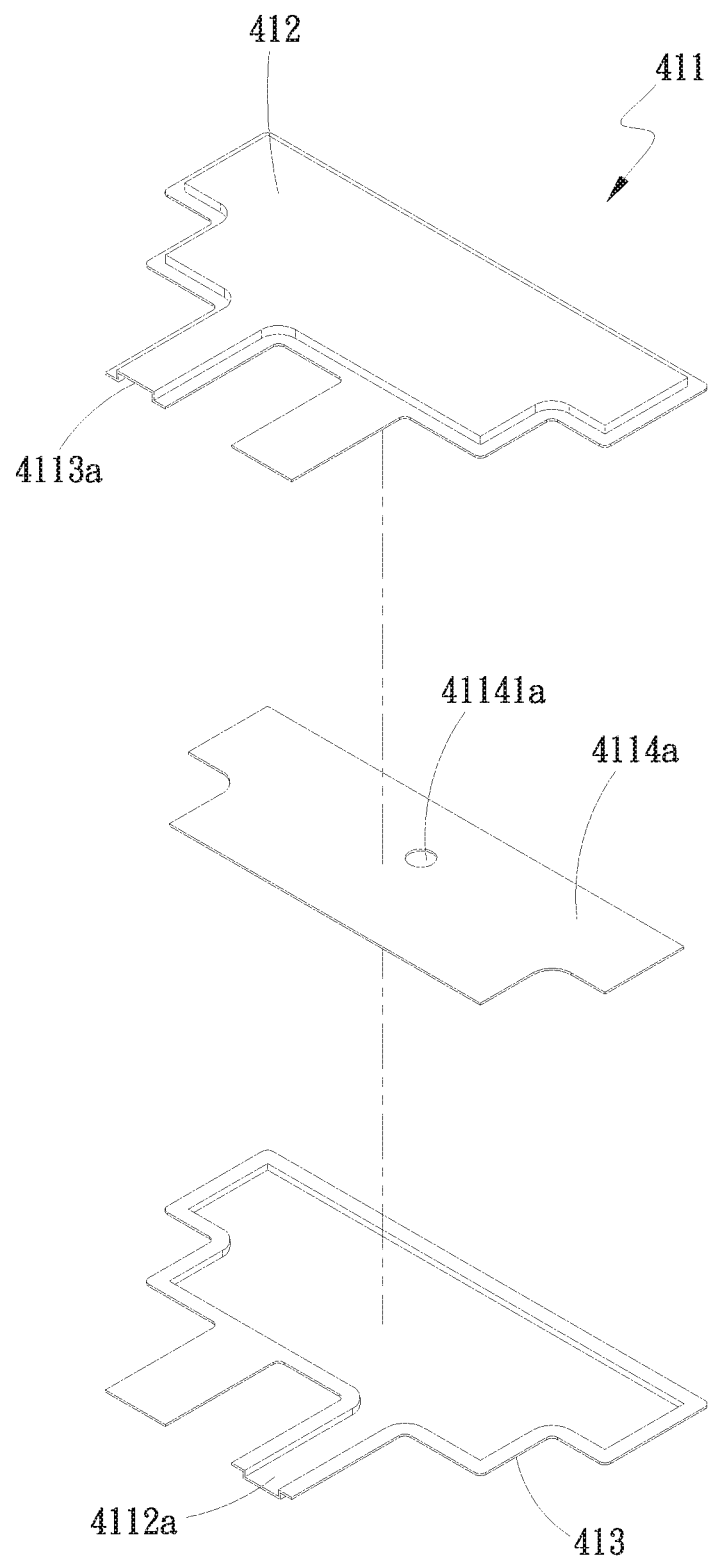
FIG. 3A is an exploded perspective view of a water-cooling radiator structure with internal partition member according to a second embodiment of the present invention.
Figure 3B:
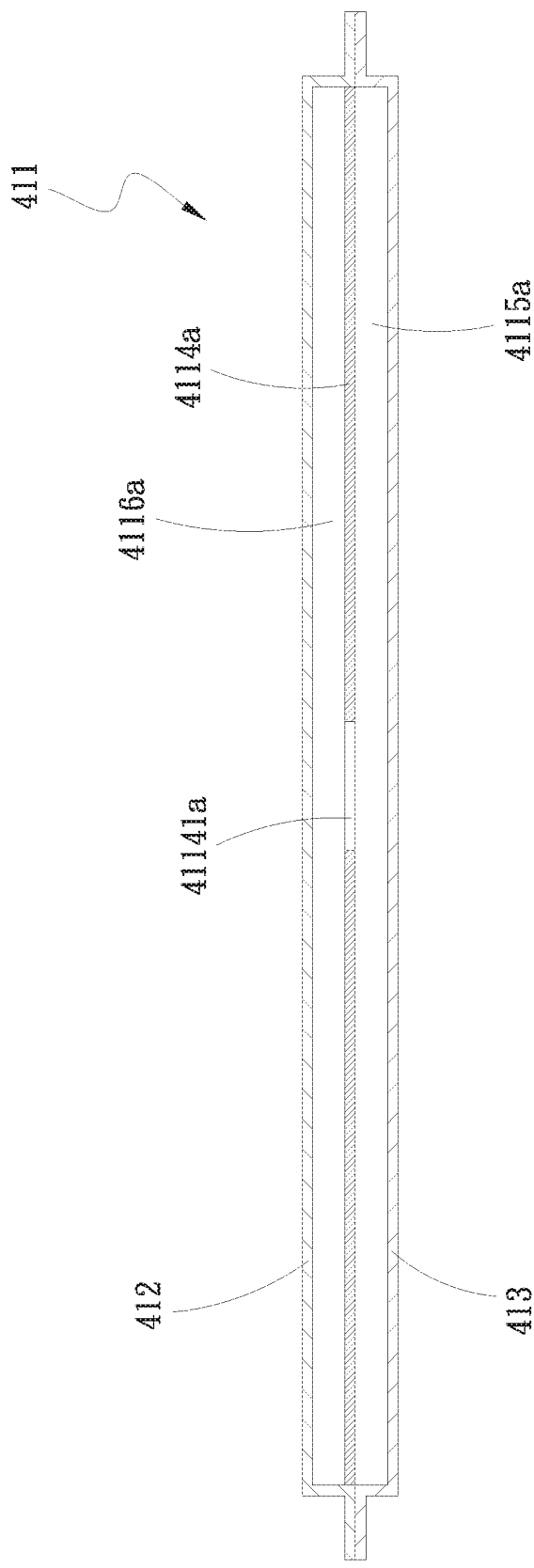
FIG. 3B is an assembled sectional view of the second embodiment of the present invention.

Please refer to FIGS. 3A and 3B that illustrate a second embodiment of the present invention. Elements that are the same in the first and the second embodiment are denoted by the same reference numerals and are not repeatedly described herein. In the second embodiment, the first water-receiving plate 411 internally includes a first partition member 4114a that horizontally divides an inner space of the first water-receiving plate 411 into a first water chamber 4115a communicable with a water inlet 4112a and a second water chamber 4116a communicable with a water outlet 4113a. The first partition member 4114a is provided with a first communicating element 41141a, which communicates the first water chamber 4115a with the second water chamber 4116a. The first water chamber 4115a is not internally provided with any partitioning rib like the first partitioning rib 4117 in the first embodiment. The working fluid flows into the first water chamber 4115a via the water inlet 4112a and keeps flowing into the second water chamber 4116a via the first communicating element 41141a, and finally leaves the second water chamber 4116a via the water outlet 4113a.

Figure 4A:
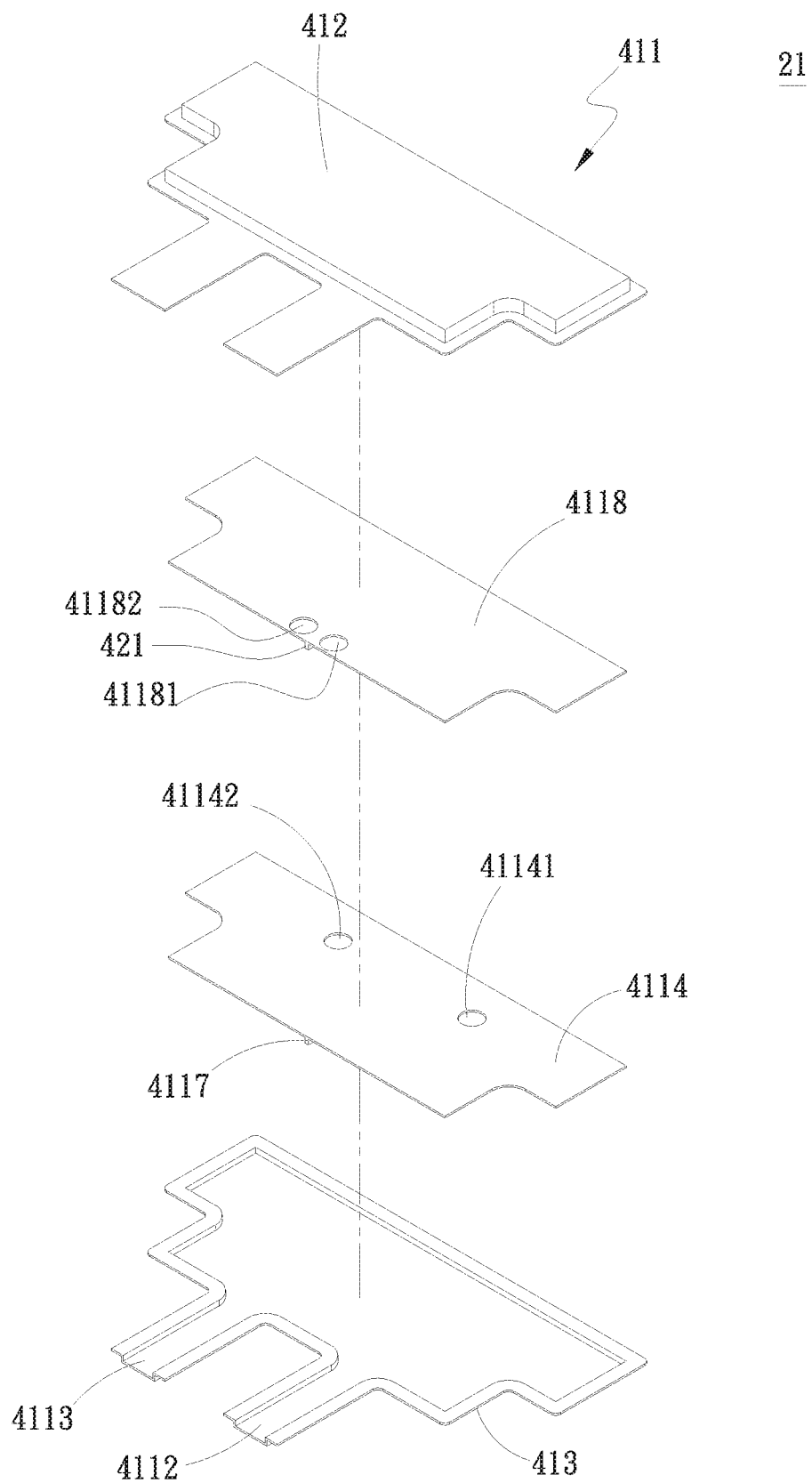
FIG. 4A is an exploded perspective view of a water-cooling radiator structure with internal partition member according to a third embodiment of the present invention.
Figure 4B:
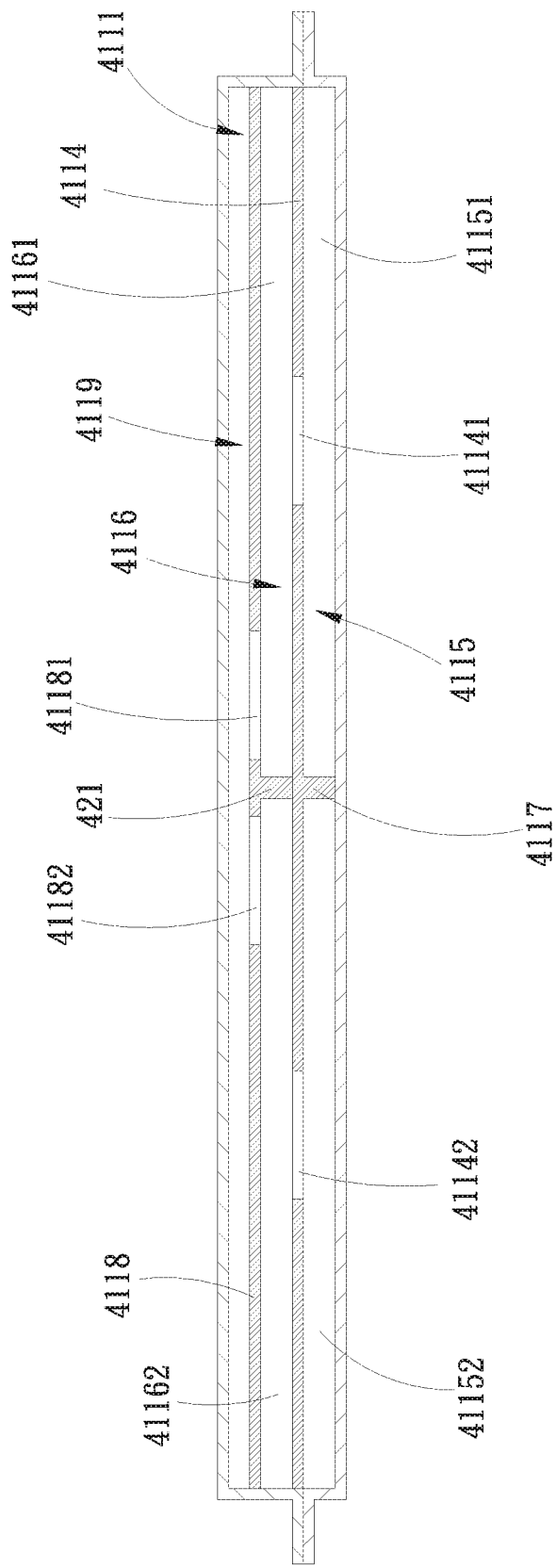
FIG. 4B is an assembled sectional view of the third embodiment of the present invention.

Please refer to FIGS. 4A and 4B that illustrate a third embodiment of the present invention. Elements that are the same in the first and the third embodiment are denoted by the same reference numerals and are not repeatedly described herein. In the third embodiment, the first partition means in the first inner space 4111 of the first water-receiving plate 411 further includes a second partition member 4118, which is located above and spaced from the first partition member 4114, such that the first inner space 4111 is horizontally divided by the first and second partition members 4114, 4118 into a first water chamber 4115, a second water chamber 4116 located above the first water chamber 4115, and a third water chamber 4119 located above the second water chamber 4116. That is, the second partition member 4118 is located between the second and the third water chamber 4116, 4119 to separate them from each other.

In the third embodiment, the second water chamber 4116 is vertically divided by a second partitioning rib 421 into a third zone 41161 correspondingly located above the first zone 41151 and a fourth zone 41162 correspondingly located above the second zone 41152. Further, the second partition member 4118 is provided with a third communicating element 41181 and a fourth communicating element 41182, which can be respectively a through hole penetrating the second partition member 4118. The third communicating element 41181 communicates the third zone 41161 of the second water chamber 4116 with the third water chamber 4119, and the fourth communicating element 41182 communicates the fourth zone 41162 of the second water chamber 4116 with the third water chamber 4119. The second partitioning rib 421 can be integrally formed with the first partition member 4114 to protrude toward the second partition member 4118, or be integrally formed with the second partition member 4118 to protrude toward the first partition member 4114. It is noted the first communicating element 41141 and the third communicating element 41181 are eccentrically arranged, which means the first and the third communicating element 41141, 41181 are offset from each other, as can be seen in FIG. 4B. With this arrangement, the working fluid having past through the first communicating element 41141 would not directly pass through the third communicating element 41181. Similarly, the second communicating element 41142 and the fourth communicating element 41182 are eccentrically arranged to be offset from each other.

The working fluid flowed into the first water chamber 4115 via the water inlet 4112 will flow through the first zone 41151 and into the second water chamber 4116 via the first communicating element 41141. Then, the working fluid keeps flowing into the third water chamber 4119 via the third communicating element 41181. The working fluid keeps flowing from the third water chamber 4119 into the second water chamber 4116 via the fourth communicating element 41182 and then flows into the second zone 41152 of the first water chamber 4115 via the second communicating element 41142. The working fluid finally leaves the first water-receiving plate 411 via the water outlet 4113.

Figure 5A:
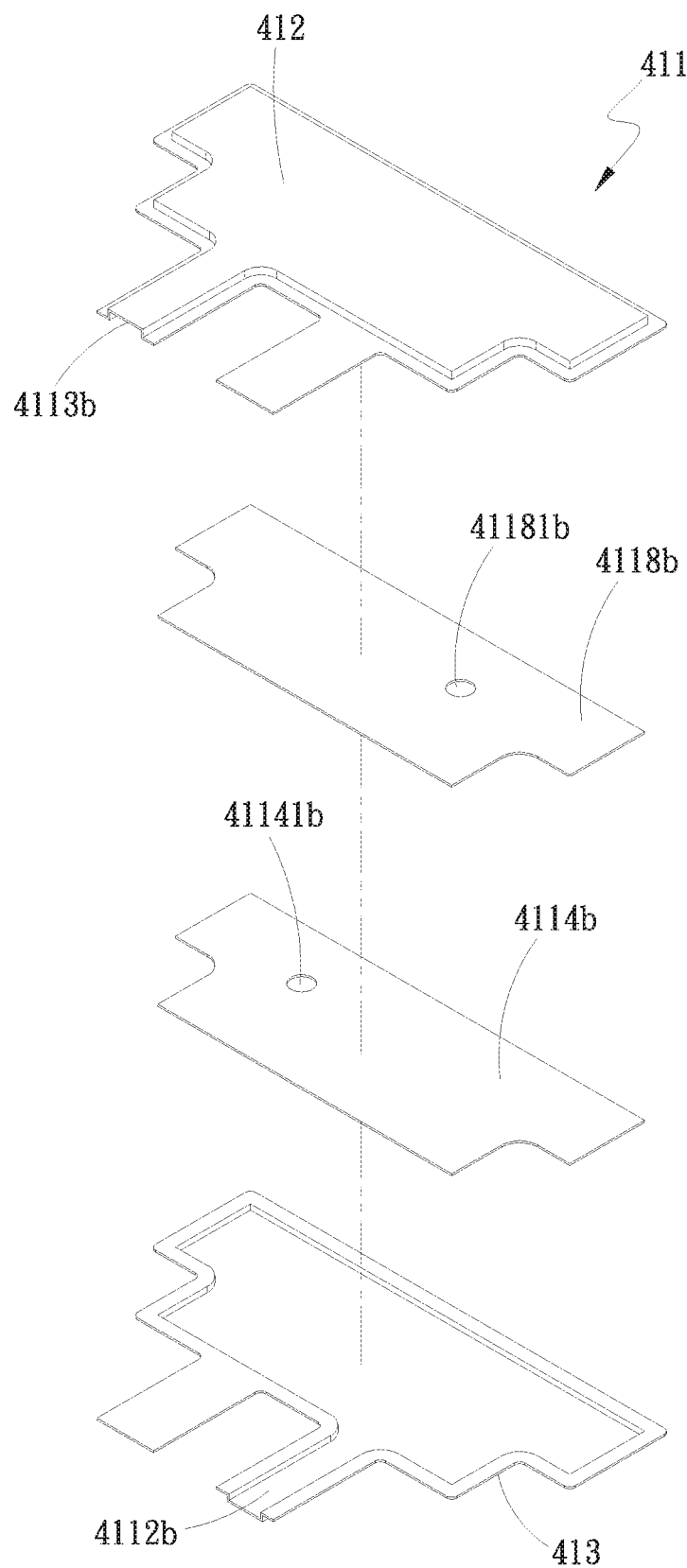
FIG. 5A is an exploded perspective view of a water-cooling radiator structure with internal partition member according to a fourth embodiment of the present invention.
Figure 5B:
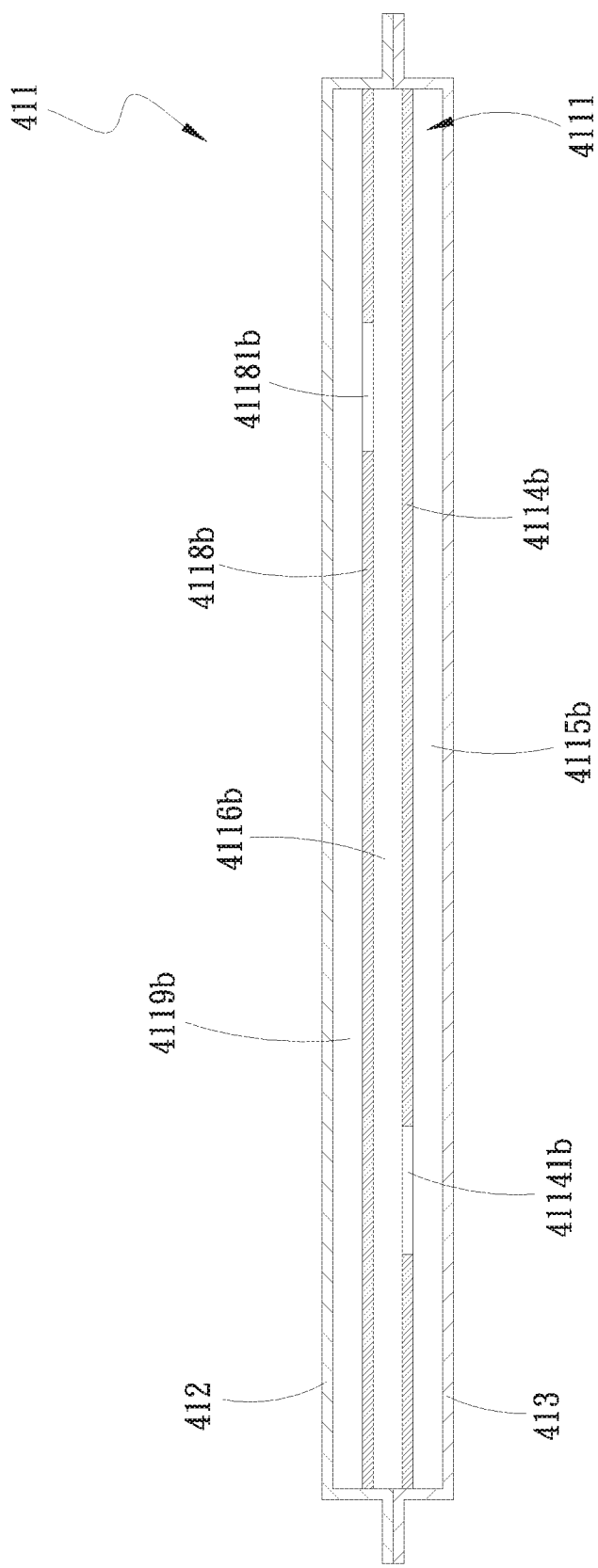
FIG. 5B is an assembled sectional view of the fourth embodiment of the present invention.

Please refer to FIGS. 5A and 5B that illustrate a fourth embodiment of the present invention. Elements that are the same in the first and the fourth embodiment are denoted by the same reference numerals and are not repeatedly described herein. In the fourth embodiment, the first partition means in the first inner space 4111 of the first water-receiving plate 411 includes a first and a second partition member 4114b 4118b, which horizontally divide the first inner space 4111 into a first water chamber 4115b, a second water chamber 4116b and a third water chamber 4119b. That is, the first partition member 4114b is located between the first and the second water chamber 4115b, 4116b; and the second partition member 4118b is located between the second and the third water chamber 4116b, 4119b. The first partition member 4114b is provided with a first communicating element 41141b that communicates the first water chamber 4115b with the second water chamber 4116b; and the second partition member 4118b is provided with a second communicating element 41181b that communicates the second water chamber 4116b with the third water chamber 4119b. The first and the second communicating element 41141b, 41181b are eccentrically arranged to be offset from each other. The first water chamber 4115b is communicable with a water inlet 4112b of the first water-receiving plate 411; and the third water chamber 4119b is communicable with a water outlet 4113b of the first water-receiving plate 411. With these arrangements, the working fluid first flows into the first chamber 4115b via the water inlet 4112b and then flows into the second water chamber 4116b via the first communicating element 41141b. The working fluid in the second water chamber 4116b further flows into the third water chamber 4119b via the second communicating element 41181b, and finally leaves the third water chamber 4119b via the water outlet 4113b.

The heat carried by the working fluid is gradually dissipated into ambient air while the heat-carrying working fluid sequentially flows through the first, the second and the third water chamber 4115b, 4116b, 4119b. More specifically, heat carried by the working fluid in the first water chamber 4115b is transferred via the first partition member 4114b to the working fluid in the second water chamber 4116b, and heat carried by the working fluid in the second water chamber 4116b is transferred via the second partition member 4118b to the working fluid in the third water chamber 4119b, so that the working fluid in the first, second and third water chambers 4115b, 4116b, 4119b can reach a homogeneous temperature.

Figure 6A:
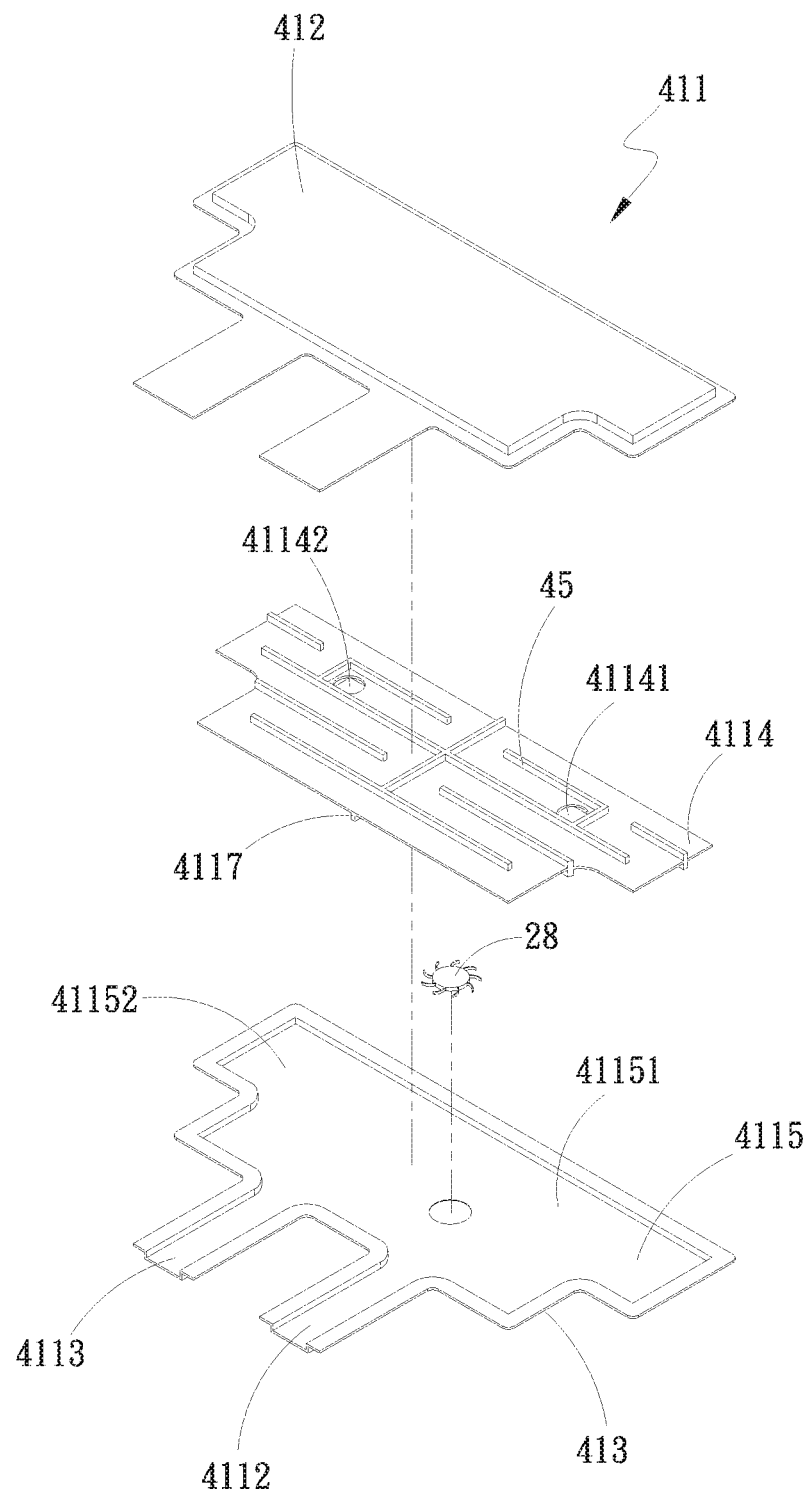
FIG. 6A is an exploded top perspective view of a water-cooling radiator structure with internal partition member according to a first variant of the first embodiment of the present invention, characterized by further including a pump and two flow passages.
Figure 6B:
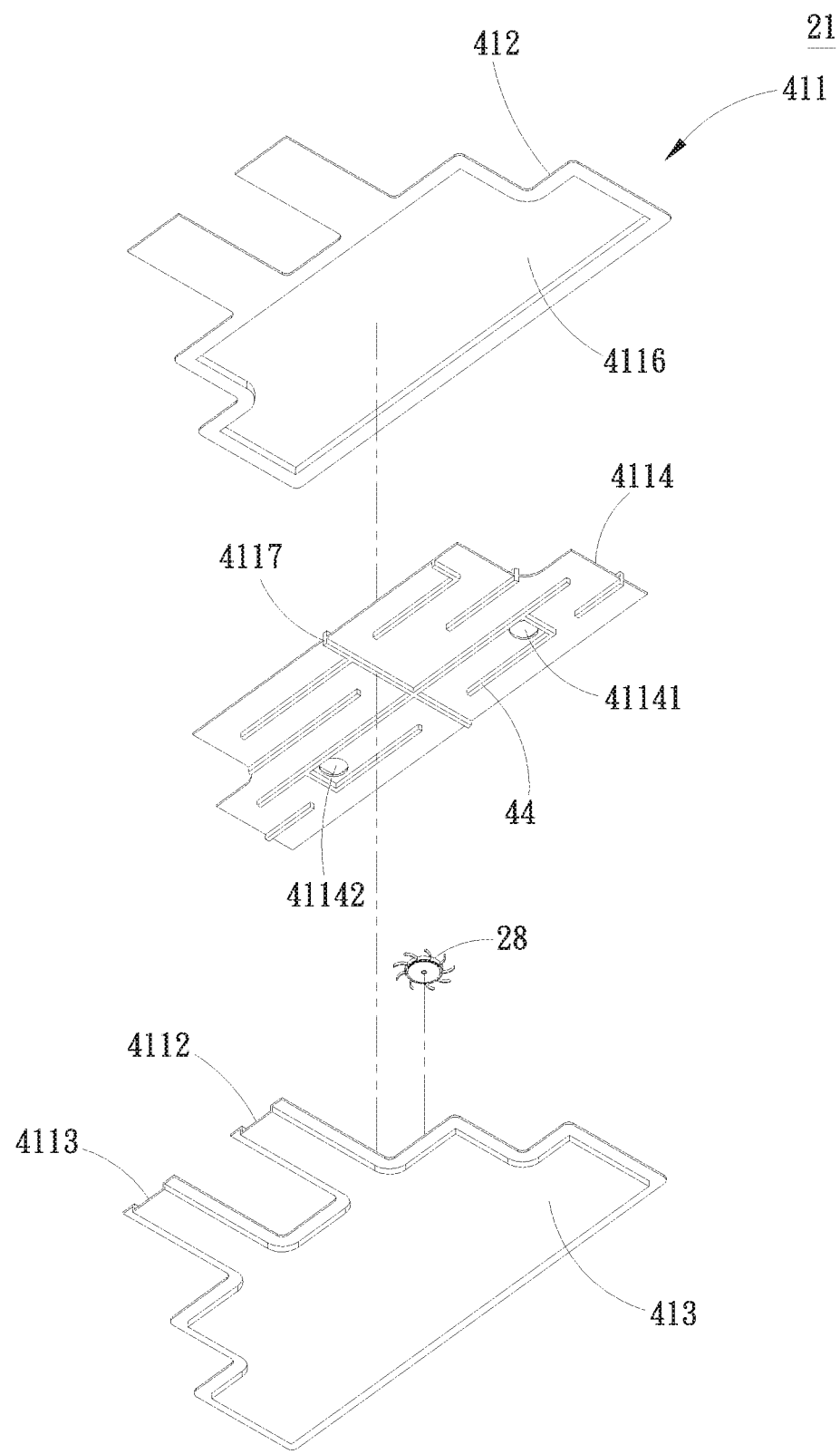
FIG. 6B is a bottom perspective view of FIG. 6A.
Figure 6C:
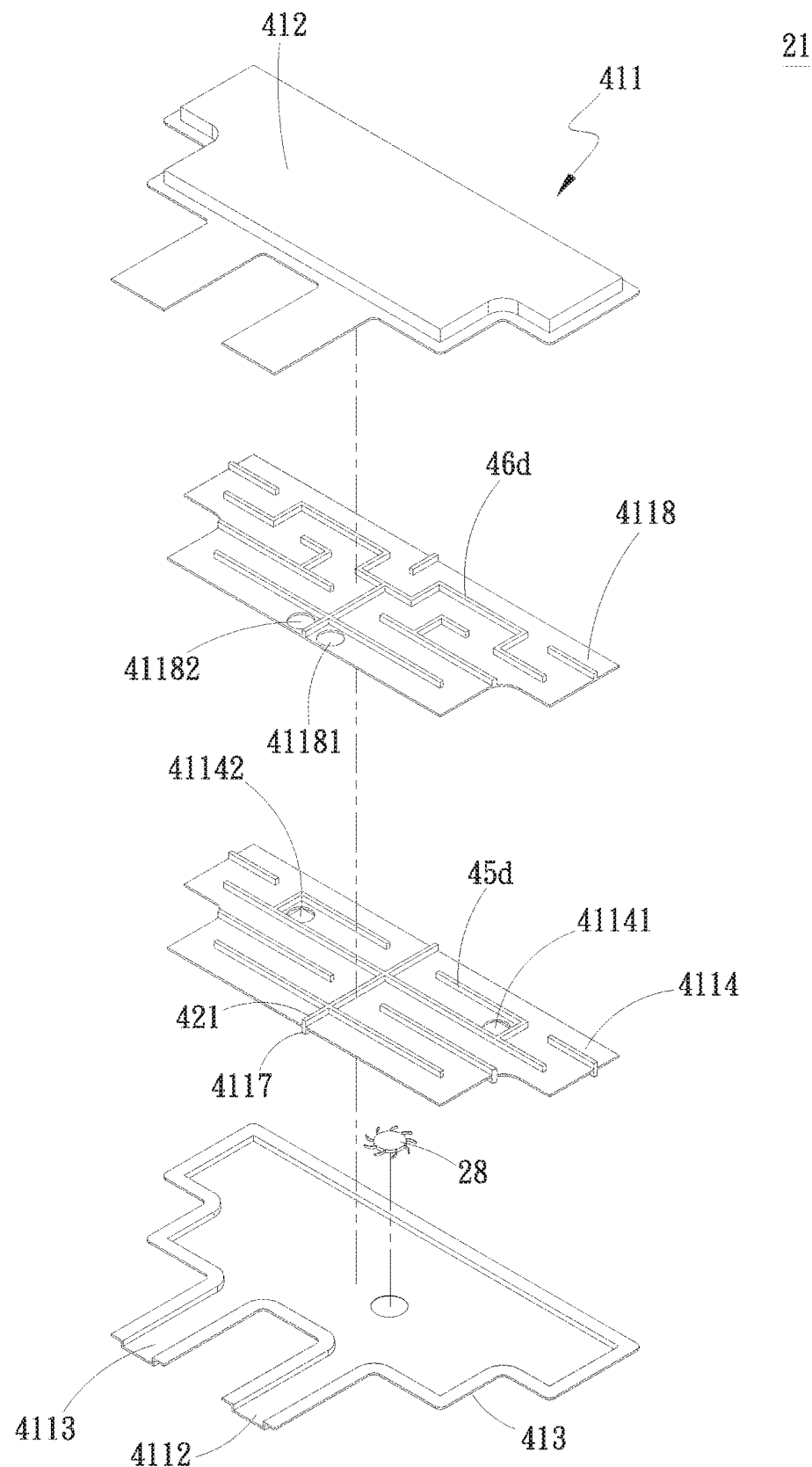
FIG. 6C is an exploded top perspective view of a water-cooling radiator structure with internal partition member according to a first variant of the third embodiment of the present invention, characterized by further including a pump and three flow passages.
Figure 6D:
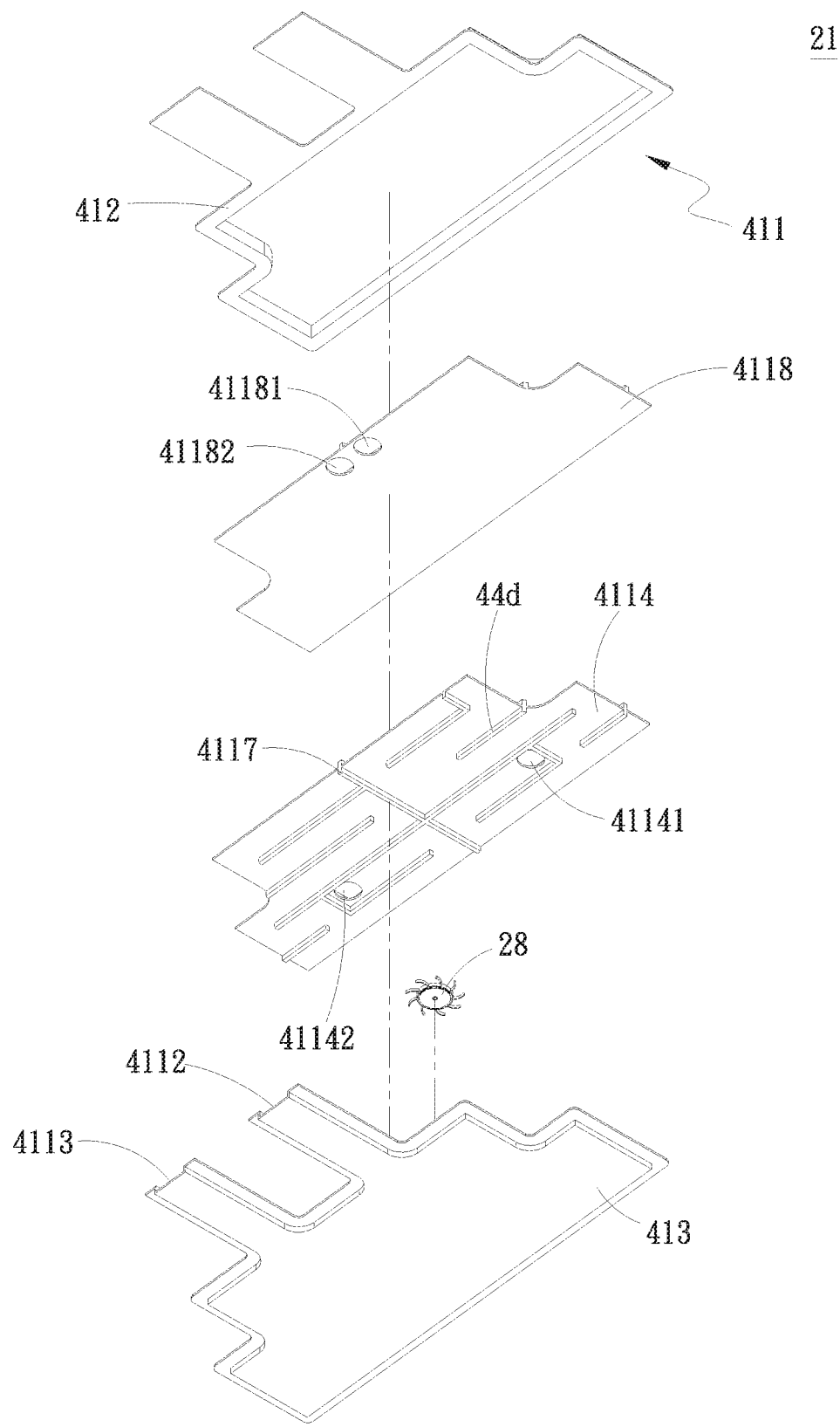
FIG. 6D is a bottom perspective view of FIG. 6C.

Please refer to FIGS. 6A and 6B that are exploded top and bottom perspective views, respectively, of a first variant of the first embodiment of the present invention; and to FIGS. 6C and 6D that are exploded top and bottom perspective views, respectively, of a first variant of the third embodiment of the present invention. According to the present invention, the water-cooling radiator structure can further include a pump 28 arranged inside or outside the first water-receiving plate 411. In the illustrated variants of the first and third embodiments, the pump 28 is arranged in the first water chamber 4115 of the first water-receiving plate 411 to drive the working fluid to flow. However, the pump 28 can be otherwise arranged in the second water chamber 4116 or the third water chamber 4119, or at the water inlet 4112 or the water outlet 4113. Further, please refer to FIGS. 6A and 6B along with FIGS. 2A to 2C. In the first variant of the first embodiment of the present invention, the first water chamber 4115 of the first water-receiving plate 411 further has a first flow passage 44 provided therein and the second water chamber 4116 has a second flow passage 45 provided therein. As can be seen in FIGS. 6A and 6B, the first flow passage 44 is formed on one side of the first partition member 4114 facing toward the first water chamber 4115 and distributed in the first zone 41151 and the second zone 41152 to serve as a guide path for the working fluid. On the other hand, the second flow passage 45 is formed on another side of the first partition member 4114 facing toward the second water chamber 4116 to serve as a guide path for the working fluid. The working fluid flowed into the first zone 41151 of the first water chamber 4115 via the water inlet 4112 flows along the first flow passage 44 toward the first communicating element 41141, via which the working fluid flows into the second water chamber 4116. Then, the working fluid flowed into the second water chamber 4116 flows along the second flow passage 45 toward the second communicating element 41142, via which the working fluid flows into the second zone 41152 of the first water chamber 4115. Thereafter, the working fluid in the second zone 41152 of the first water chamber 4115 flows along the first flow passage 44 toward the water outlet 4113 and finally leaves the first water-receiving plate 411 via the water outlet 4113. The provision of the first and second flow passages 44, 45 increases the time for the working fluid to flow in the first and the second water chamber 4115, 4116 and the time for the working fluid to exchange heat with the first water-receiving plate 411.

Also please refer to FIGS. 6C and 6D along with FIGS. 4A and 4B. In the first variant of the third embodiment of the present invention, the first water chamber 4115 of the first water-receiving plate 411 further has a first flow passage 44d provided therein, the second water chamber 4116 has a second flow passage 45d provided therein, and the third water chamber 4119 has a third flow passage 46d provided therein. As can be seen in FIG. 6D, the first flow passage 44d is formed on one side of the first partition member 4114 facing toward the first water chamber 4115; and as can be seen in FIG. 6C, the second flow passage 45d is formed on another side of the first partition member 4114 facing toward the second water chamber 4116 and the third flow passage 46d is formed on one side of the second partition member 4118 facing toward the third water chamber 4119. The first, second and third flow passages 44d, 45d, 46d not only serve as guide paths for the working fluid, but also increase the time for the working fluid to flow in the first, second and third water chambers 4115, 4116, 4119 as well as the time for the working fluid to exchange heat with the first water-receiving plate 411.

Figure 7A:
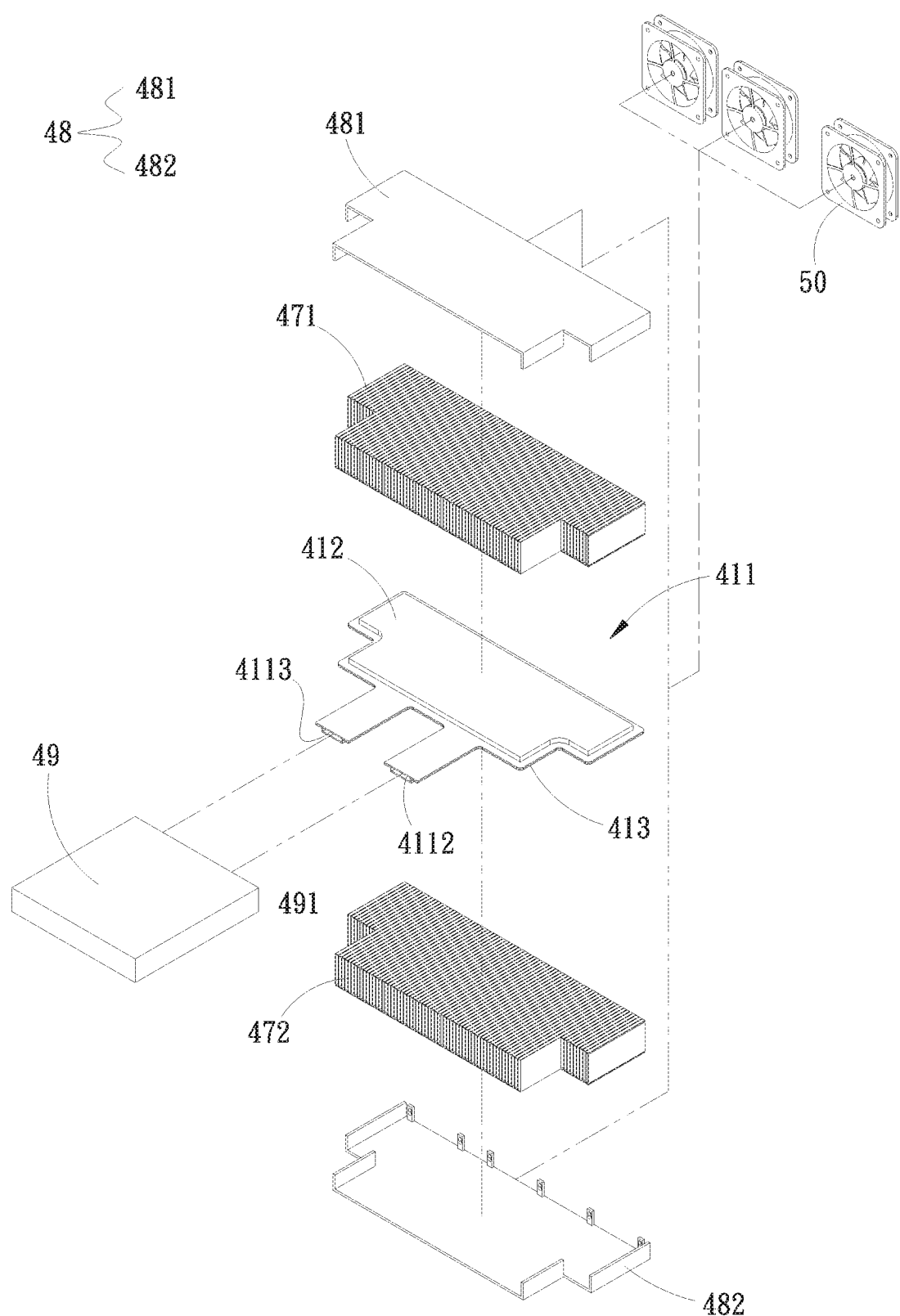
FIGS. 7A and 7B are exploded and assembled perspective views, respectively, of a water-cooling radiator structure with internal partition member according to a second variant of the first embodiment of the present invention, characterized by further including a plurality of radiating fin assemblies, a protection unit and at least one fan and having a water block unit connected thereto.
Figure 7B:
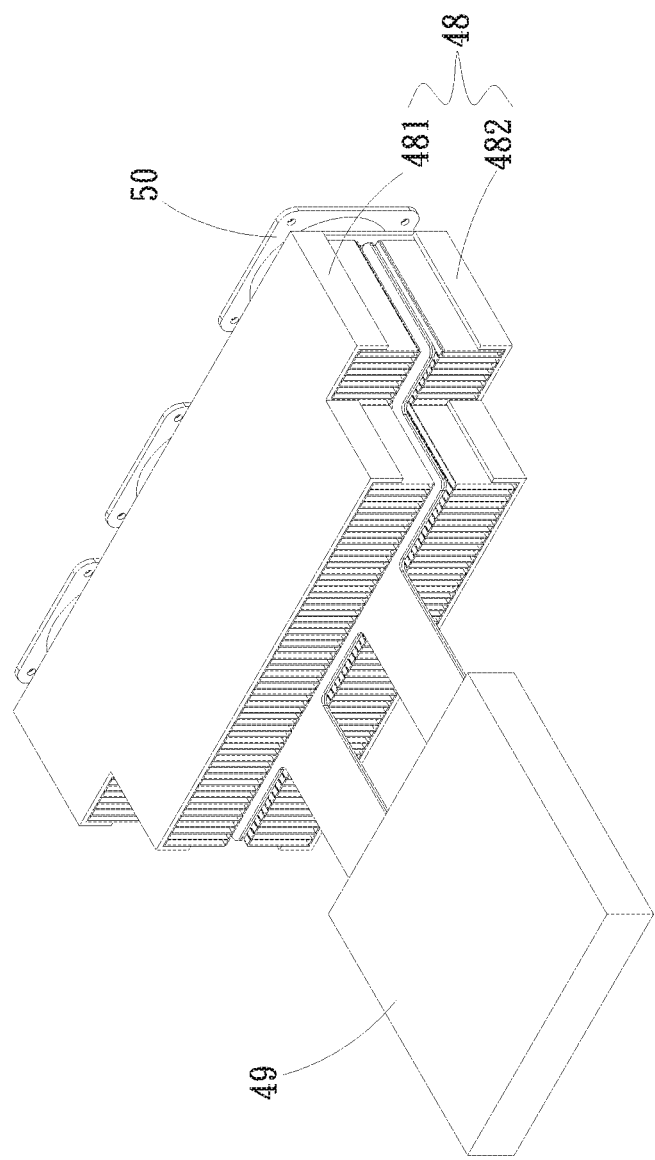

FIGS. 7A and 7B are exploded and assembled perspective views, respectively, of a water-cooling radiator structure with internal partition member according to a second variant of the first embodiment of the present invention. Please refer to FIGS. 7A and 7B along with FIGS. 2A to 2C. In the second variant of the first embodiment, the first water-receiving plate 411 further includes a first radiating fin assembly 471 and a second radiating fin assembly 472 connected to an outer surface of the first top plate member 412 and of the first bottom plate member, respectively, to enable enhanced heat dissipation effect. The first and the second radiating fin assembly 471, 472 respectively include a plurality of radiating fins. The second variant of the first embodiment also includes a protection unit 48 and at least one fan 50. The protection unit 48 can be, for example, in the form of a cover consisting of a first protection part 481 and a second protection part 482, which protectively cover the first water-receiving plate 411, the first radiating fin assembly 471 and the second radiating fin assembly 472 in between them. The at least one fan 50 is connected to the protection unit 48 with an air outlet of the fan facing toward the first water-receiving plate 411, the first radiating fin assembly 471 and the second radiating fin assembly 472, so that airflows produced by the at least one fan 50 flow toward the first water-receiving plate 411, the first radiating fin assembly 471 and the second radiating fin assembly 472 to helpfully achieve enhanced heat dissipation.

The water-cooling radiator structure according to the second variant of the first embodiment of the present invention shown in FIGS. 7A and 7B also has a water block unit 49 fluid-communicably connected to the water inlet 4112 and the water outlet 4113 of the first water-receiving plate 411. The water block unit 49 is in contact with at least one heat-producing element. The working fluid in the water block unit 49 absorbs heat produced by the heat-producing element before it flows into the first water-receiving plate 411 via the water inlet 4112. Then, the working fluid is cooled in the first water-receiving plate 411 and flows back into the water block unit 49 via the water outlet 4113.

In the above embodiments and variants thereof, the first water-receiving plate 411 can be made of gold, silver, copper, iron, titanium, aluminum or stainless steel, or any alloy of these metal materials.

Figure 8A:
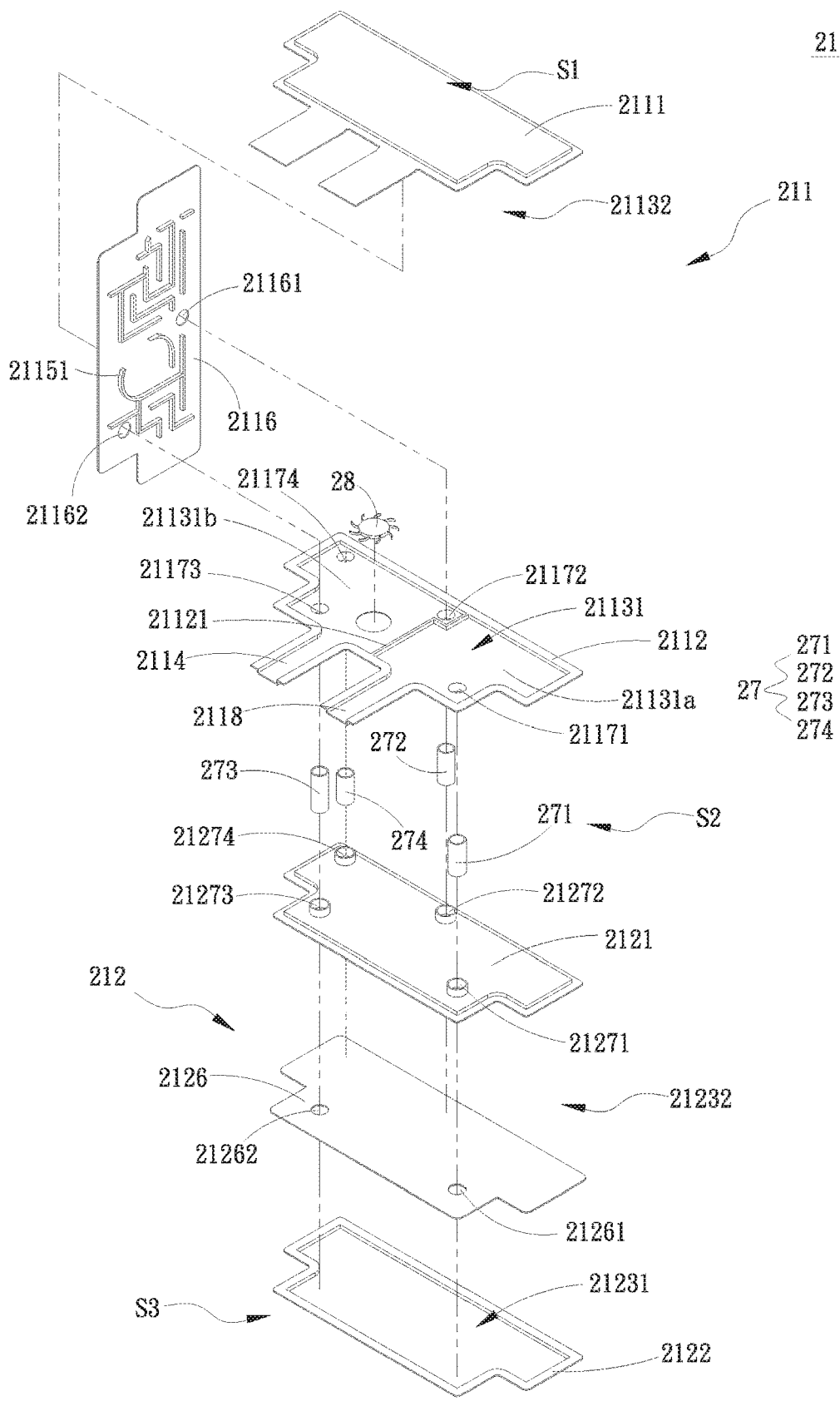
FIGS. 8A and 8B are exploded and assembled perspective views, respectively, of a water-cooling radiator structure with internal partition member according to a fifth embodiment of the present invention.
Figure 8B:
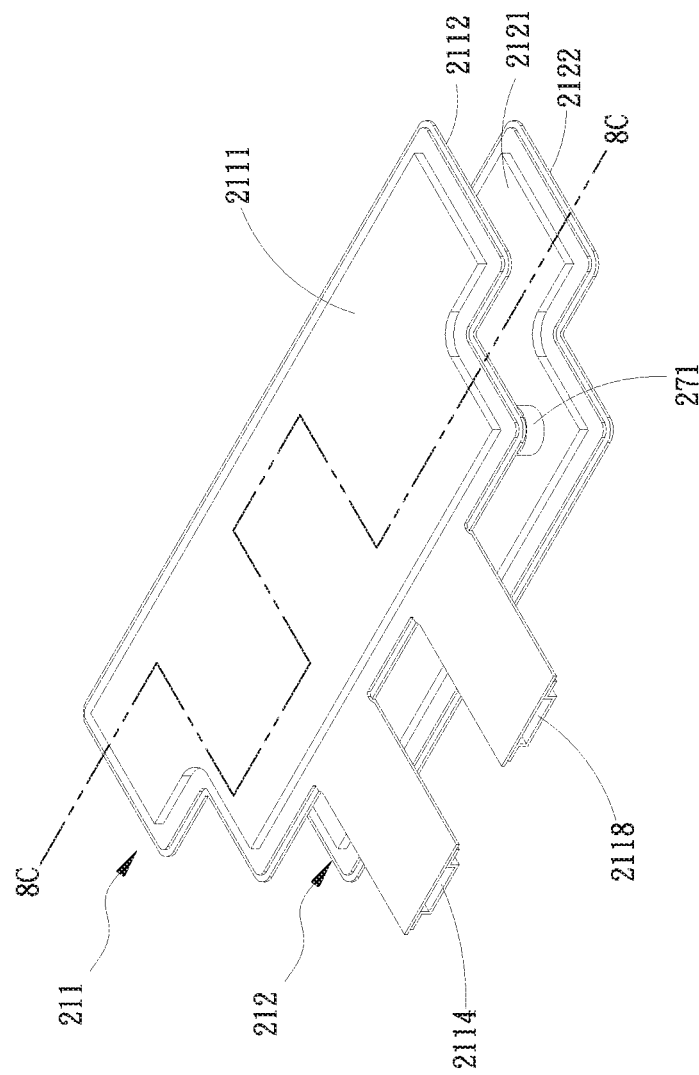
Figure 8C:
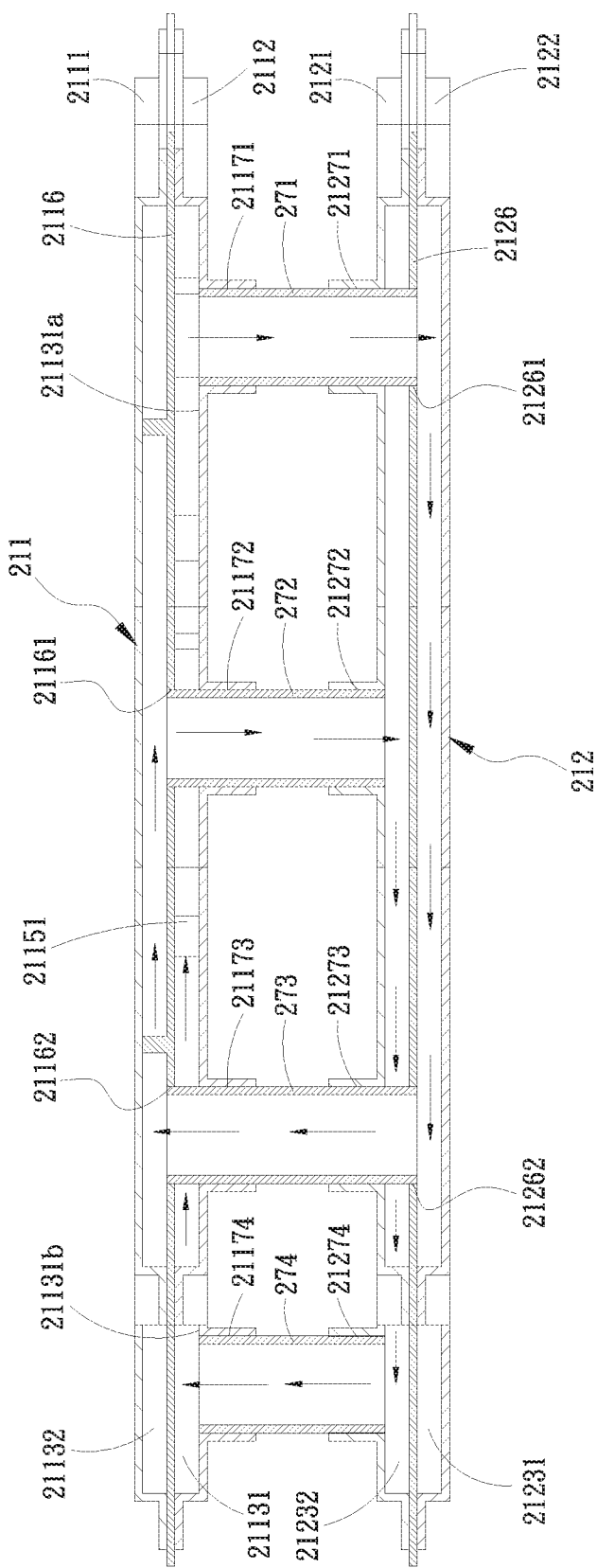
FIG. 8C is a sectional view taken along line 8C-8C of FIG. 8B.
Figure 8D:
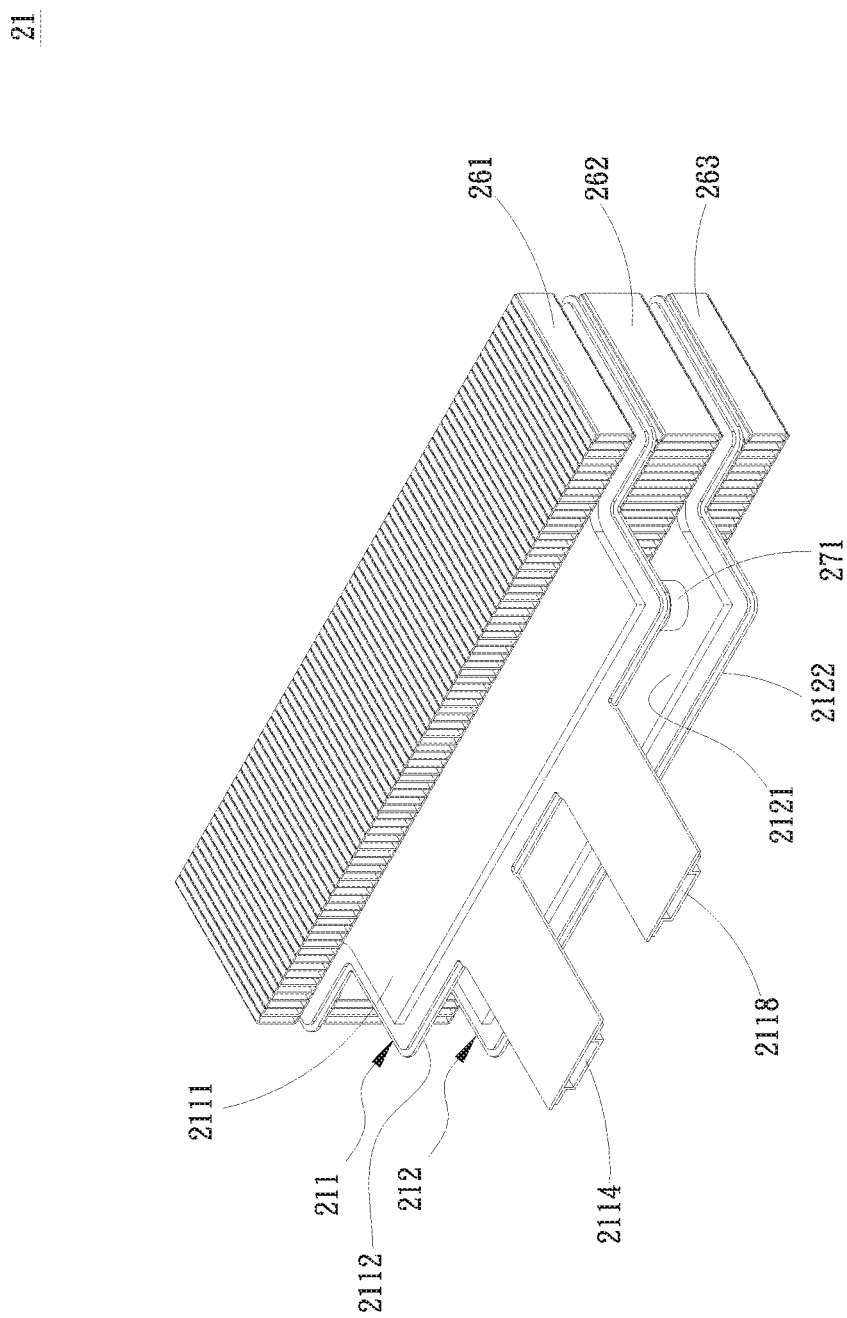
FIG. 8D is an assembled perspective view of a first variant of the fifth embodiment of the present invention, characterized by further including a plurality of radiating fin assemblies.

Please refer to FIGS. 8A and 8B that are exploded and assembled perspective views, respectively, of a water-cooling radiator structure with internal partition member according to a fifth embodiment of the present invention; and to FIG. 8C that is a sectional view taken along line 8C-8C of FIG. 8B. As shown, in the fifth embodiment of the present invention, the water-cooling radiator structure includes a water-cooling radiator unit 21. The water-cooling radiator unit 21 includes a first and a second water-receiving plate 211, 212, which are spaced from each other with the first water-receiving plate 211 located above the second water-receiving plate 212. An open space located at one side of the first water-receiving plate 211 facing away from the second water-receiving plate 212 is defined as a first heat dissipation space s1; an open space located between the first and the second water-receiving plate 211, 212 is defined as a second heat dissipation space s2; and an open space located at one side of the second water-receiving plate 212 facing away from the first water-receiving plate 211 is defined as a third heat dissipation space s3. In a first variant of the fifth embodiment as shown in FIG. 8D, a first radiating fin assembly 261 is connected to the first water-receiving plate 211 and located in the first heat dissipation space s1; a second radiating fin assembly 262 is connected to between the first and the second water-receiving plate 211, 212 and located in the second heat dissipation space s2; and a third radiating fin assembly 263 is connected to the second water-receiving plate 212 and located in the third heat dissipation space s3. The first, second and third radiating fin assemblies 261, 262, 263 respectively include a plurality of radiating fins to helpfully increase the heat dissipation areas of the first and the second water-receiving plate 211, 212 and accordingly, enable an upgraded heat dissipation efficiency of the water-cooling radiator structure.

Please refer back to FIGS. 8A to 8C. In the fifth embodiment, the first water-receiving plate 211 has an enclosure formed of a first top plate member 2111 and a first bottom plate member 2112, and is internally provided between the first top and bottom plate members 2111, 2112 with a first partition member 2116 to horizontally divide a first inner space of the first water-receiving plate 211 into a first water chamber 21131 and a second water chamber 21132 located above the first water chamber 21131. The first and the second water chamber 21131, 21132 are two independent chambers separated by the first partition member 2116 and not directly communicable with each other. That is, the first water chamber 21131 is formed between the first bottom plate member 2112 and the first partition member 2116, while the second water chamber 21132 is formed between the first top plate member 2111 and the first partition member 2116. A raised rib portion 21121 is provided on the first bottom plate member 2112 to protrude into the first water chamber 21131 and vertically divide the same into a flow-in zone 21131a and a flow-out zone 21131b. One peripheral edge of the first water-receiving plate 211 has two outward protruded portions to form at least one water inlet 2118 and at least one water outlet 2114, which are fluid-communicable with the flow-in zone 21131a and the flow-out zone 21131b, respectively, of the first water chamber 21131.

Further, the first bottom plate member 2112 of the first water-receiving plate 211 is provided with a first, a second, a third and a fourth opening 21171, 21172, 21173, 21174, which penetrate the first bottom plate member 2112; and the first partition member 2116 is provided with a first and a second hole 21161, 21162 that penetrate the first partition member 2116 and are located corresponding to the second and the third opening 21172, 21173, respectively.

The second water-receiving plate 212 has an enclosure formed of a second top plate member 2121 and a second bottom plate member 2122, and is internally provided between the second top and bottom plate members 2121, 2122 with a second partition member 2126 to horizontally divide a second inner space of the second water-receiving plate 212 into a third water chamber 21231 and a fourth water chamber 21232 located above the third water chamber 21231. The third and the fourth water chamber 21231, 21232 are two independent chambers separated by the second partition member 2126 and not directly communicable with each other. That is, the third water chamber 21231 is formed between the second bottom plate member 2122 and the second partition member 2126, while the fourth water chamber 21232 is formed between the second top plate member 2121 and the second partition member 2126.

The second top plate member 2121 of the second water-receiving plate 212 is provided with a fifth, a sixth, a seventh and an eighth opening 21271, 21272, 21273, 21274, which penetrate the second top plate member 2121; and the second partition member 2126 is provided with a third and a fourth hole 21261, 21262 that penetrate the second partition member 2126 and are located corresponding to the fifth and the seventh opening 21271, 21273, respectively.

The water-cooling radiator structure according to the fifth embodiment further includes a communicating element unit 27 consisting of a first, a second, a third and a fourth communicating element 271, 272, 273, 274, which can be, for example, a pipe each. The first communicating element 271 communicates the flow-in zone 21131a of the first water chamber 21131 with the third water chamber 21231; the second communicating element 272 communicates the second water chamber 21132 with the fourth water chamber 21232; the third communicating element 273 communicates the second water chamber 21132 with the third water chamber 21231; and the fourth communicating element 274 communicates the flow-out zone 21131b of the first water chamber 21131 with the fourth water chamber 21232. The communicating element unit 27 guides a working fluid to flow through each of the first, second, third and fourth water chamber 21131, 21132, 21231, 21232 along predetermined flow paths.

As can be seen in FIGS. 8A to 8C, the first communicating element 271 has an end passing through the first opening 21171 to communicate with the flow-in zone 21131a of the first water chamber 21131; the second communicating element 272 has an end passing through the second opening 21172 and the first hole 21161 to communicate with the second water chamber 21132; the third communicating element 272 has an end passing through the third opening 21173 and the second hole 21162 to communicate with the second water chamber 21132; and the fourth communicating element 274 has an end passing through the fourth opening 21174 to communicate with the flow-out zone 21131b of the first water chamber 21131. Another end of the first communicating element 271 passes through the fifth opening 21271 and the third hole 21261 to communicate with the third water chamber 21231; another end of the second communicating element 272 passes through the sixth opening 21272 to communicate with the fourth water chamber 21232; another end of the third communicating element 273 passes through the seventh opening 21273 and the fourth hole 21262 to communicate with the third water chamber 21231; and another end of the fourth communicating element 274 passes through the eighth opening 21274 to communicate with the fourth water chamber 21232.

As indicated by arrows in FIG. 8C, the working fluid flows into the flow-in zone 21131a of the first water chamber 21131 via the at least one water inlet 2118 and then flows into the third water chamber 21231 via the first communicating element 271. The working fluid in the third water chamber 21231 flows into the second water chamber 21132 via the third communicating element 273 and then flows into the fourth water chamber 21232 via the second communicating element 272. The working fluid in the fourth water chamber 21232 flows into the flow-out zone 21131b of the first water chamber 21131 via the fourth communicating element 274. Finally, the working fluid leaves the first water chamber 21131 via the at least one water outlet 2114.

According to the fifth embodiment, at least one pump 28 can be optionally arranged in the first water chamber 21131 or the second water chamber 21132 of the first water-receiving plate 211. However, the above description is only illustrative without limiting the present invention in any way. The at least one pump 28 can be otherwise arranged in the third water chamber 21231 or the fourth water chamber 21232 of the second water-receiving plate 212. The pump 28 can include, for example, an impeller and a driving motor for driving the impeller to rotate and accordingly, bring the working fluid in the water chambers to flow. The driving motor can be, for example, a submersible motor or a waterproof motor. As can be seen in FIG. 8A, in the illustrated fifth embodiment, one pump 28 is arranged in the flow-out zone 21131b of the first water chamber 21131. For this purpose, the first bottom plate member 2112 of the first water-receiving plate 211 is provided with a recess corresponding to the pump 28. The recess does not penetrate the first bottom plate member 2112, so that the pump 28 is stably seated in the recess.

Also shown in FIGS. 8A to 8C, the first partition member 2116 is provided on one side facing the first water chamber 21131 with a first flow passage 21151 to serve as a guide path for the working fluid flowing through the first water chamber 21131. The first flow passage 21151 is distributed in the flow-in zone 21131a and the flow-out zone 21131b. The first flow passage 21151 can be integrally formed with the first partition member 2116, or can be an individual member connected to one side of the first partition member 2116. The first flow passage 21151 can be formed of a plurality of winding partitioning ribs or can be formed of a plurality of winding guide grooves. The working fluid flows into the flow-in zone 21131a of the first water chamber 21131 via the at least one water inlet 2118 and is guided by the first flow passage 21151 to flow into the third water chamber 21231 via the first communicating element 271. Also, the working fluid flows into the flow-out zone 21131b of the first water chamber 21131 via the fourth communicating element 274 and is guided by the first flow passage 2115 to flow out of the first water chamber 21131 via the at least one water outlet 2114. The provision of the first flow passage 21151 enables extended time for the working fluid to exchange heat with the first water-receiving plate 211, so that heat absorbed and carried by the working fluid can be fully transferred to the first water-receiving plate 211, from where the heat is dissipated into ambient air. The provision of the first flow passage also extends the time for the working fluid in the first water chamber 21131 to exchange heat with the working fluid in the second water chamber 21132.

Figure 8E:
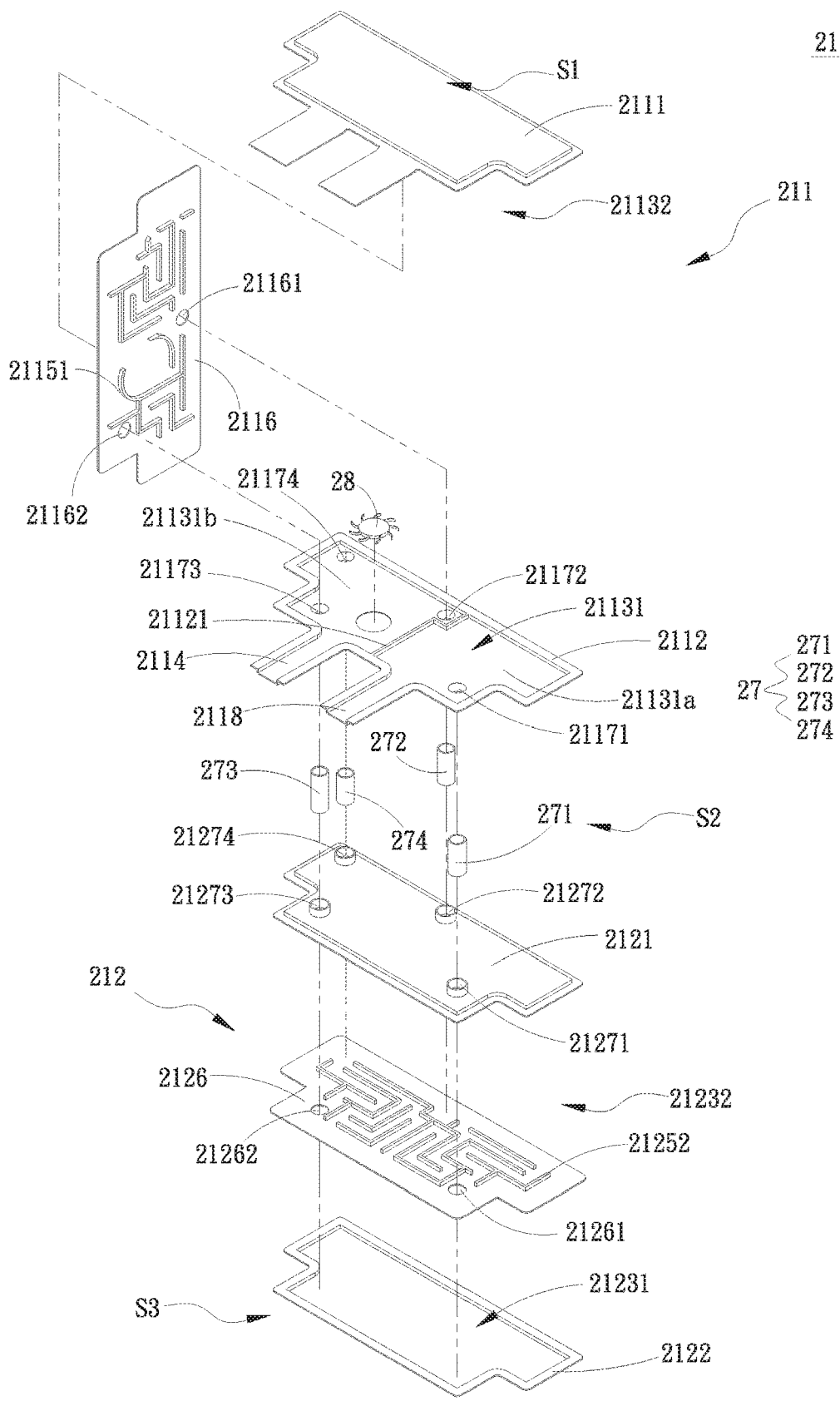
FIGS. 8E to 8G illustrate different examples of flow passage arrangements for the fifth embodiment of the present invention and different variants thereof.
Figure 8F:
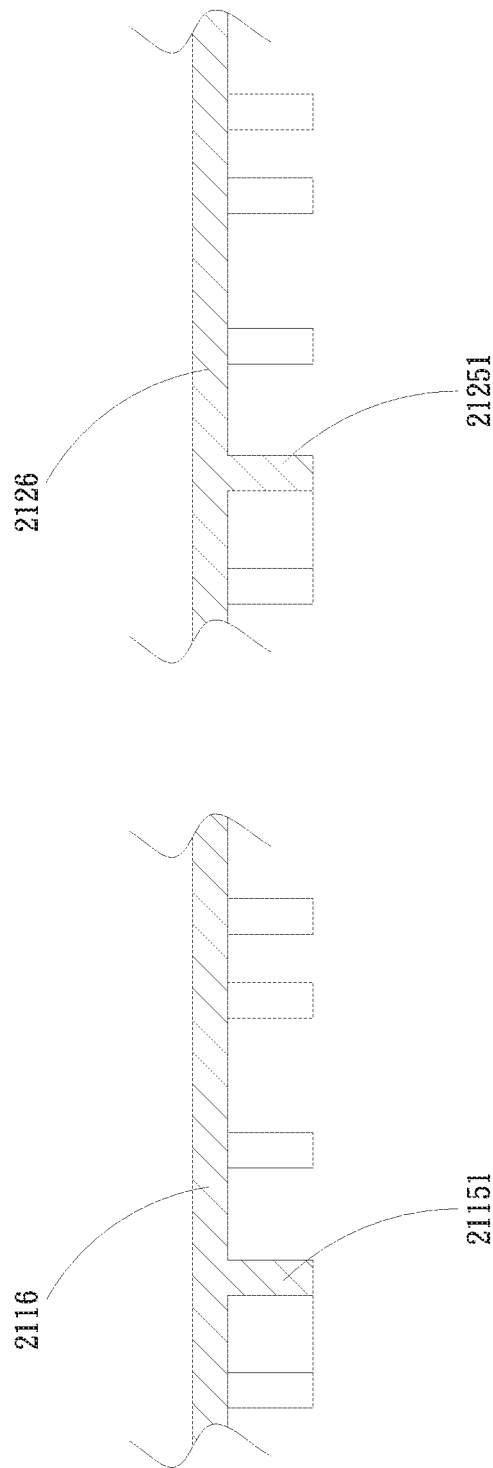
Figure 8G:
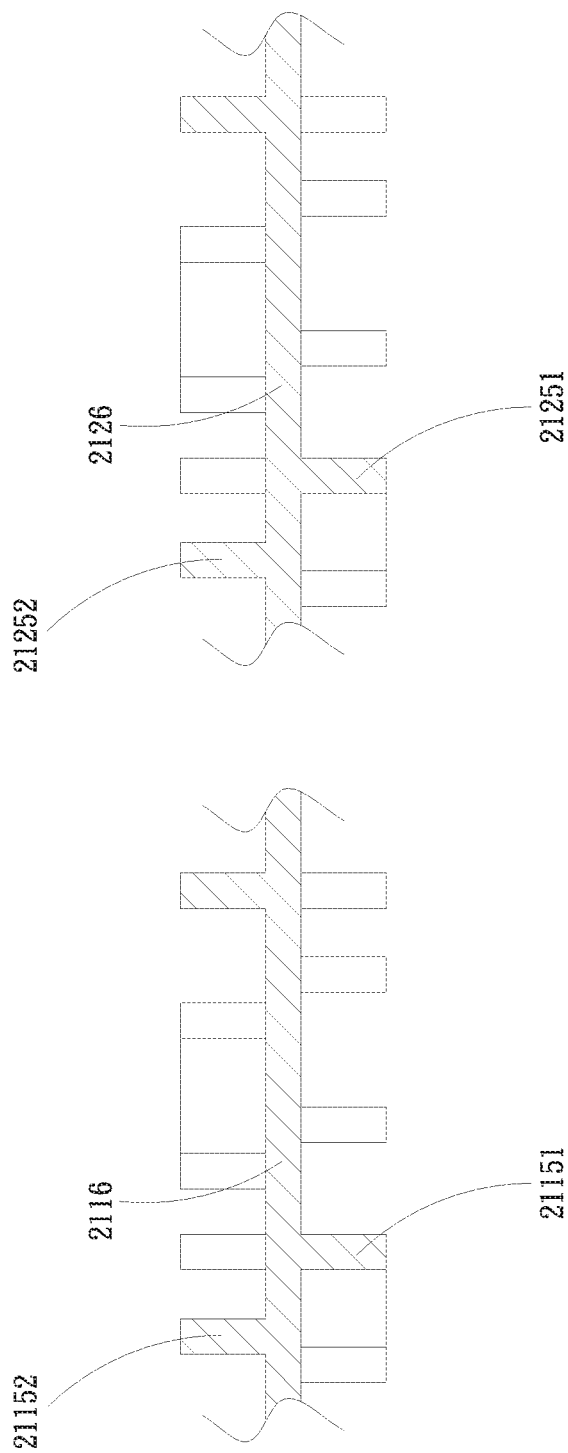
Figure 8H:
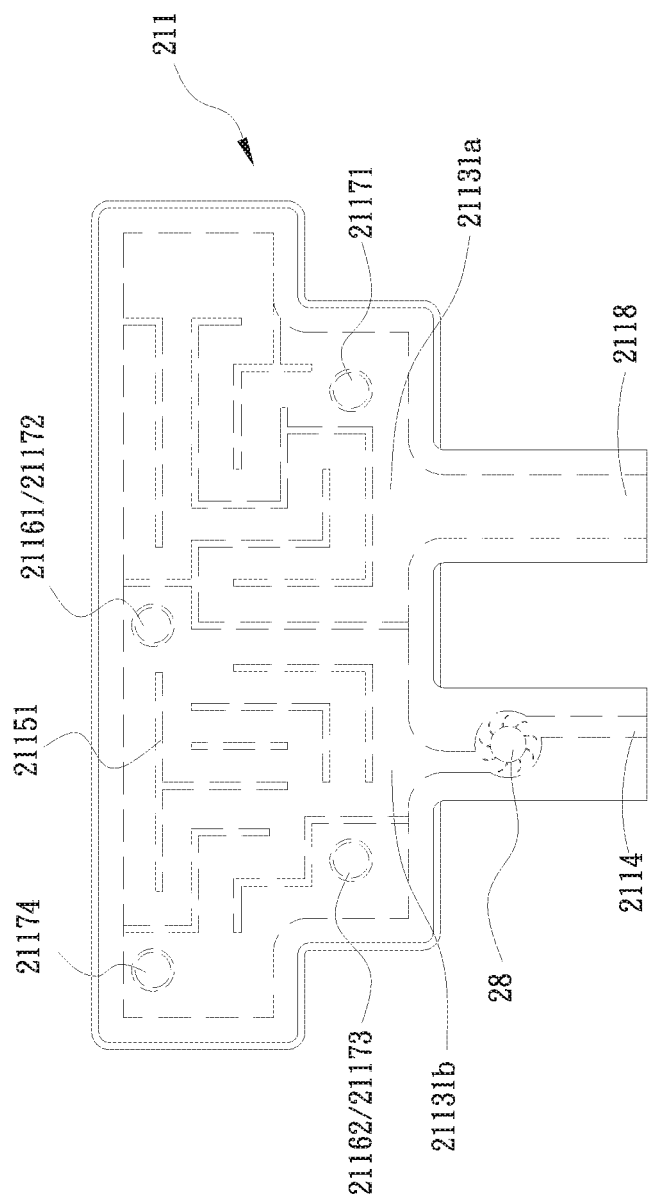
FIGS. 8H and 8I illustrate different examples of pump arrangements for the fifth embodiment of the present invention and different variants thereof.
Figure 8I:
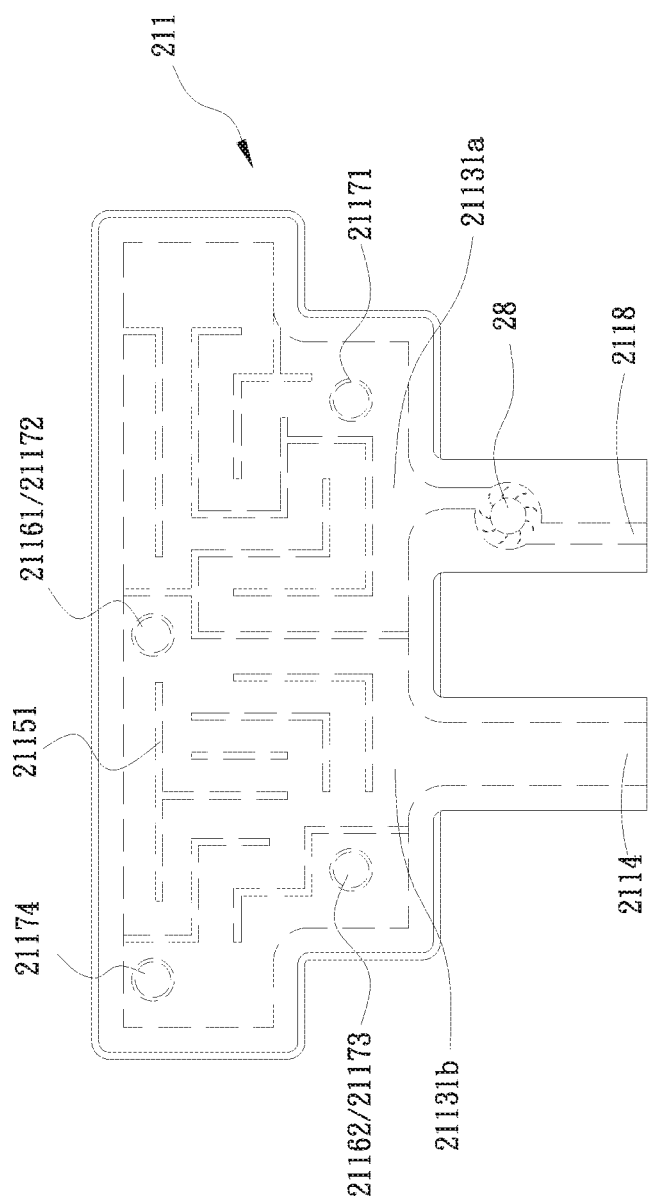
Figure 8J:
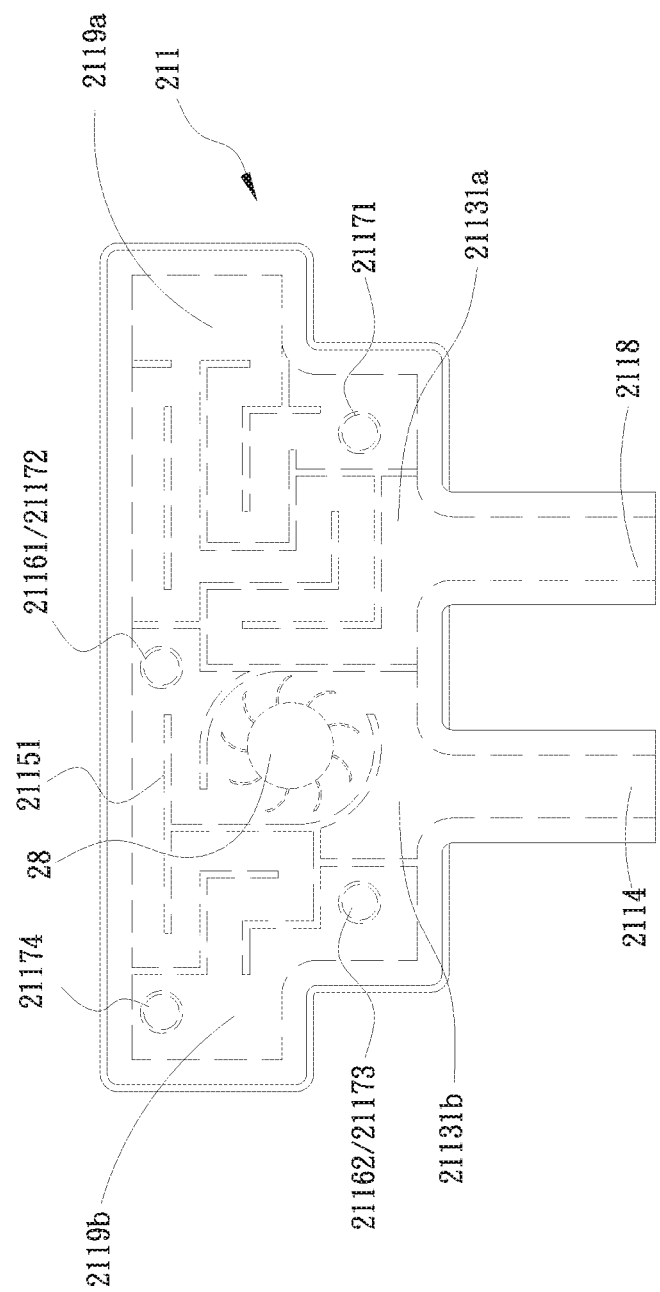
FIG. 8J is a top phantom view of a first water-receiving plate in the fifth embodiment of the present invention.

FIG. 8J is a top phantom view of the first water-receiving plate 211 according to the fifth embodiment of the present invention. Please refer to FIGS. 8A and 8J at the same time. In the illustrated fifth embodiment, the pump 28 is arranged in the flow-out zone 21131b of the first water chamber 21131, and the part of the first flow passage 21151 that is distributed in the flow-out zone 21131b is a flow guiding structure taking the position of the pump 28 into consideration, in order to correctly guide the working fluid that is driven by the pump 28 to flow. It is noted at least one fluid storing space is provided in the first water chamber 21131 without being occupied by the first flow passage 21151, and the working fluid can be stored in the fluid storing space. In the illustrated fifth embodiment, a space in the flow-in zone 21131a of the first water chamber 21131 that is not occupied by the first flow passage 21151 is used as a first fluid storing space 2119a, and a space in the flow-out zone 21131b of the first water chamber 21131 that is not occupied by the first flow passage 21151 is used as a second fluid storing space 2119b.

Please refer to FIGS. 8E to 8G that illustrate different examples of flow passage arrangements that can be provided on the first partition member 2116 and the second partition member 2126 in the fifth embodiment of the present invention and different variants thereof. As shown in FIG. 8G, according to an operable variant of the fifth embodiment, a second flow passage 21152 is further provided on another side of the first partition member 2116 facing toward the second water chamber 21132. According to another operable variant of the fifth embodiment, a third flow passage 21251 is further provided on one side of the second partition member 2126 facing toward the third water chamber 21231, as shown in FIG. 8F. According to a further operable variant of the fifth embodiment, a fourth flow passage 21252 is further provided on another side of the second partition member 2126 facing toward the fourth water chamber 21232, as shown in FIGS. 8E and 8G. The second, third and fourth flow passages 21152, 21251, 21252 are structurally similar to the first flow passage 21151. The provision of the second flow passage 21152 increases the time for the working fluid to flow in the second water chamber 21132; the provision of the third flow passage 21251 increases the time for the working fluid to flow in the third water chamber 21231; and the provision of the fourth flow passage 21252 increases the time for the working fluid to flow in the fourth water chamber 21232. Meanwhile, the first and second flow passages 21151, 21152 enable increased time for the working fluid in the first water chamber 21131 to exchange heat with the working fluid in the second water chamber 21132, and the third and fourth flow passages 21251, 21252 enable increased time for the working fluid in the third water chamber 21231 to exchange heat with the working fluid in the fourth water chamber 21232.

In the first variant of the fifth embodiment shown in FIG. 8D, heat carried by the working fluid is transferred to the first top plate member 2111 and the first bottom plate member 2112 of the first water-receiving plate 211, and is finally dissipated into ambient air from the first, second and third radiating fin assemblies 261, 262, 263.

Please refer to FIGS. 8H and 8I that illustrate different examples of pump arrangements for the fifth embodiment of the present invention and different variants thereof. In FIG. 8H, the pump 28 is arranged at the water outlet 2114 of the first water-receiving plate 211. On the other hand, in FIG. 8I, the pump 28 is arranged at the water inlet 2118 of the first water-receiving plate 211. It is noted, in the water inlet 2118 or the water outlet 2114, a flow guiding structure corresponding to the pump 28 is provided to guide the working fluid driven by the pump 28 to flow through the water inlet 2118 or the water outlet 2114.

Figure 9A:
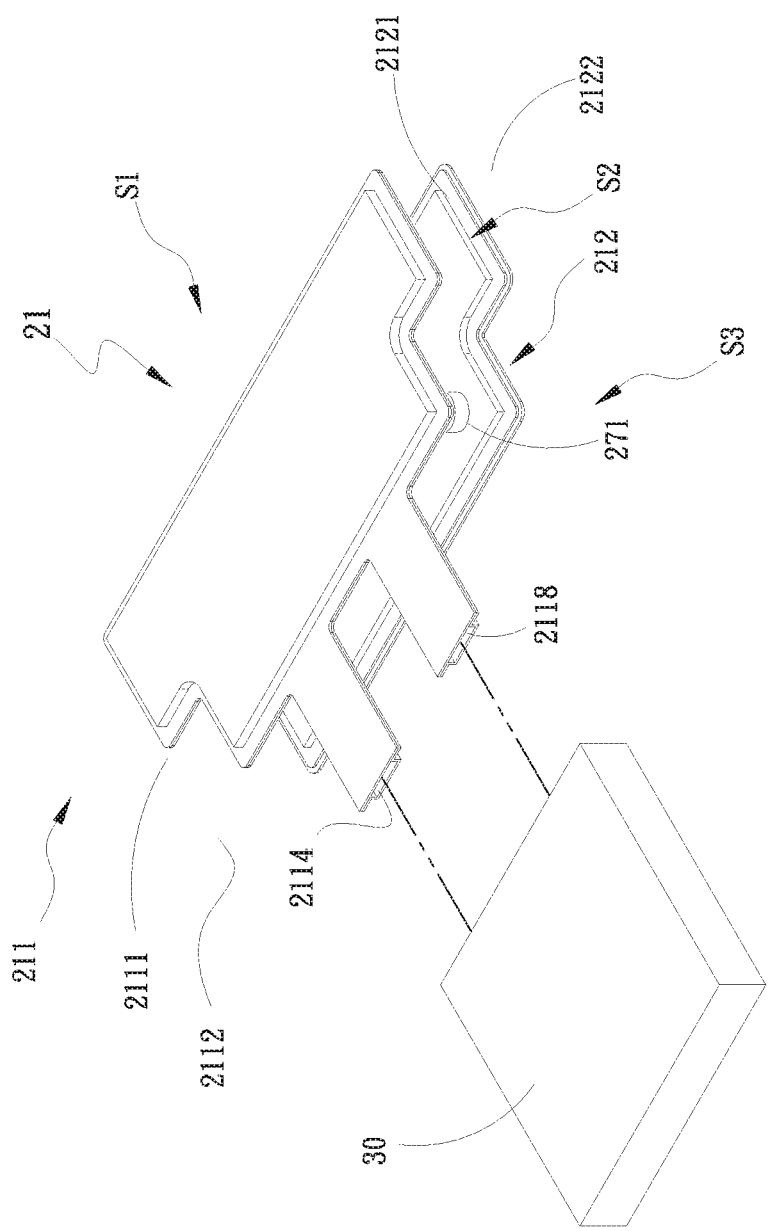
FIGS. 9A and 9B are exploded and assembled perspective views, respectively, of a second variant of the fifth embodiment of the present invention, characterized by having a water block unit connected thereto.
Figure 9B:
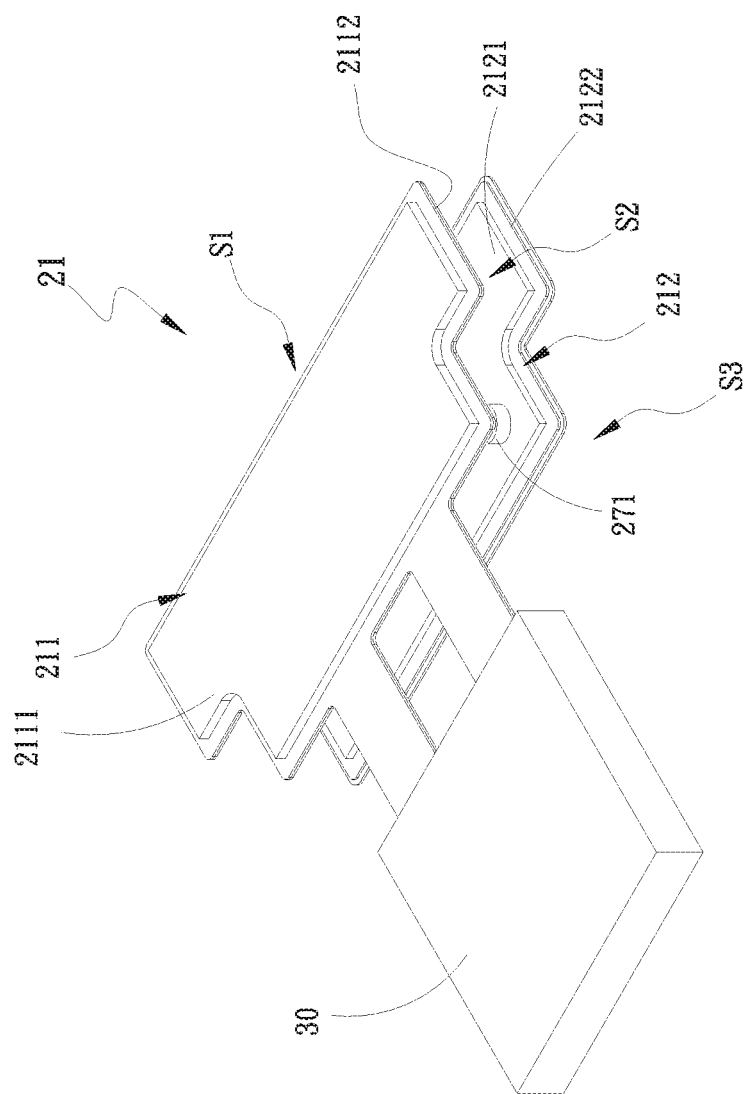

FIGS. 9A and 9B are exploded and assembled perspective views, respectively, of a second variant of the fifth embodiment of the present invention, characterized by having a water block unit 30 connected thereto. Please refer to FIGS. 9A and 9B along with FIGS. 8A to 8C. The water-cooling radiator unit 21 is fluid-communicably connected to the water block unit 30 via the at least one water inlet 2118 and the at least one water outlet 2114 provided on the first water chamber 21131 of the first water-receiving plate 211. The water block unit 30 is in contact with at least one heat-producing element. The working fluid left the first water-receiving plate 211 via the water outlet 2114 flows into the water block unit 30 to exchange heat with the heat-producing element before it flows out of the water block unit 30 into the first water-receiving plate 211 via the water inlet 2118, and heat carried by the working fluid is dissipated into ambient air from the water-cooling radiator unit 21.

Figure 9C:
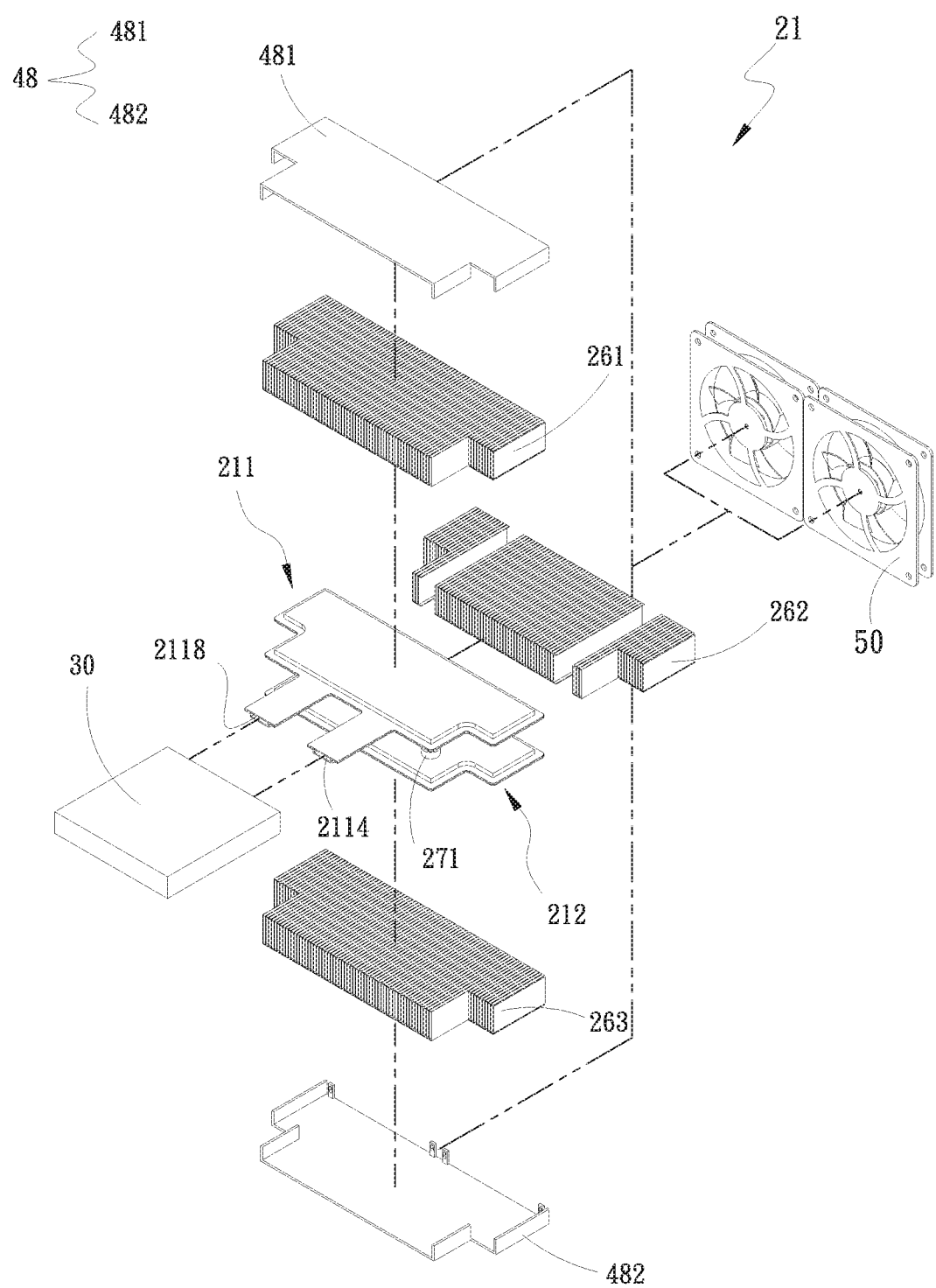
FIGS. 9C and 9D are exploded and assembled perspective views, respectively, of a third variant of the fifth embodiment of the present invention, which is a combination of the first and second variants of the fifth embodiment and further includes a protection unit and at least one fan.
Figure 9D:
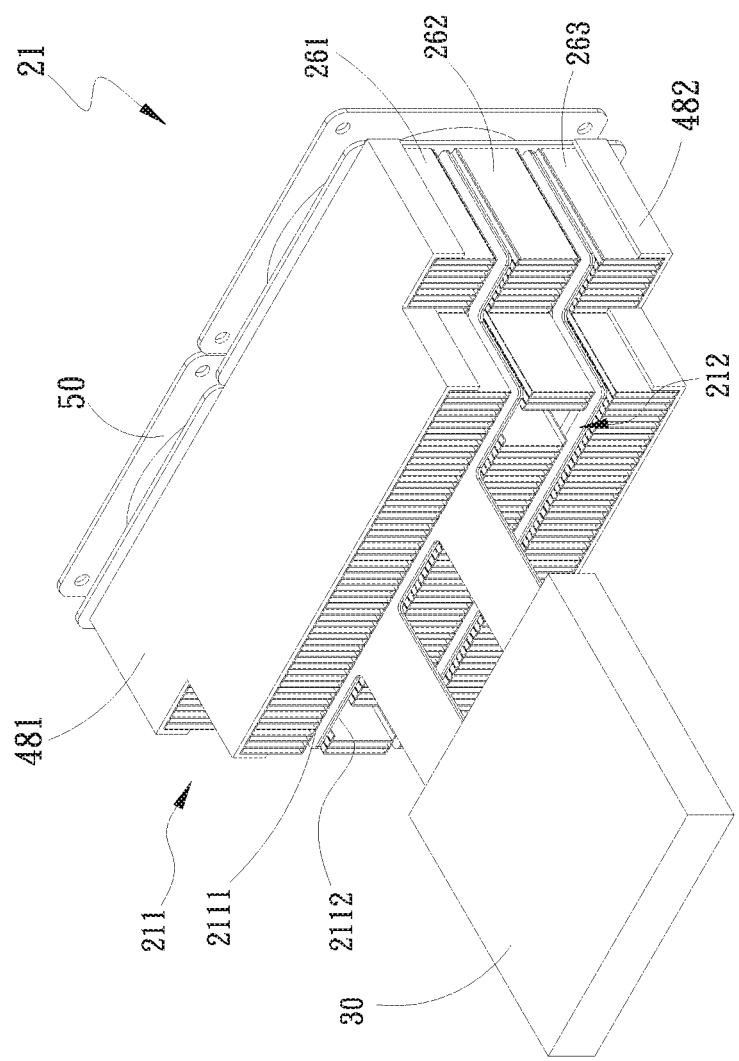
Figure 9D:

FIGS. 9C and 9D are exploded and assembled perspective views, respectively, of a third variant of the fifth embodiment of the present invention, which is a combination of the first and second variants of the fifth embodiment and further includes a protection unit 48 and at least one fan 50. According to the third variant of the fifth embodiment, after the working fluid has flowed into the water-cooling radiator unit 21, heat carried by the working fluid is transferred to the first water-receiving plate 211 and the second water-receiving plate 212 and is finally dissipated into ambient air from the first, the second and the third radiating fin assembly 261, 262, 263. The protection unit 48 can be, for example, in the form of a cover consisting of a first protection part 481 and a second protection part 482, which protectively cover the water-cooling radiator unit 21 to protect the first water-receiving plate 211, the second water-receiving plate 212, the first radiating fin assembly 261, the second radiating fin assembly 262 and the third radiating fin assembly 263 against dust and damage. The at least one fan 50 can be optionally connected to the protection unit 48 with an air outlet of the fan 50 facing toward the water-cooling radiator unit 21 to produce airflows against the first and second water-receiving plates 211, 212 as well as the first, second and third radiating fin assemblies 261, 262, 263 to enable an enhanced heat dissipation effect.

The above-described first and second water-receiving plates 211, 212 as well as the first, second, third and fourth communicating elements 271, 272, 273, 274 can be made of gold, silver, copper, iron, titanium, aluminum or stainless steel or any alloy of these metals. Among others, titanium has high metal strength and low weight as well as good heat transfer efficiency to enable effectively upgraded heat dissipation effect and reduced overall weight of the water-cooling radiator structure.

With the above arrangements, the embodiments of the present invention and the variants thereof can provide desired heat dissipation effect and solve the problems in the prior art water-cooling radiator structure.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water-cooling radiator structure with an internal partition member comprising:

a water block unit and a water-cooling radiator unit contacting a heat source via the water block unit and including a first water-receiving plate defining a first inner space receiving a working fluid flowed thereinto, a water inlet connected directly to the water block unit and the first inner space, and a water outlet connected directly to the water block unit and the first inner space; and the working fluid flowing into the first inner space via the water inlet and leaving the first inner space via the water outlet; and the first inner space of the first water-receiving plate is provided with at least one first partition to horizontally divide the first inner space into a plurality of independent water chambers, wherein the at least one first partition includes a first partition member located between the first and a second water chamber to separate them from each other and to horizontally divide the first inner space of the first water-receiving plate into a first water chamber and a second water chamber located above the first water chamber; the first water chamber being provided with a first flow passage therein while the second water chamber being provided with a second flow passage therein, wherein the first water-receiving plate includes a first partitioning rib provided in the first water chamber to vertically divide the same into a first zone communicable with the water inlet and a second zone communicable with the water outlet, and the first partition member is provided with a first communicating element and a second communicating element; the first communicating element communicating the first zone of the first water chamber with the second water chamber, and the second communicating element communicating the second zone of the first water chamber with the second water chamber.

2. The water-cooling radiator structure with internal partition member as claimed in claim 1, wherein the first water-receiving plate is formed of a first top plate member and a first bottom plate member and the at least one partition is located between the first top plate member and the first bottom plate member.

\* \* \* \* \*